United States Patent
Suzuki

(10) Patent No.: US 7,459,711 B2
(45) Date of Patent: Dec. 2, 2008

(54) SURFACE MOUNT TYPE PHOTO INTERRUPTER AND METHOD FOR MANUFACTURING THE SAME

(75) Inventor: Nobuaki Suzuki, Funai-gun (JP)

(73) Assignee: Rohm Co., Ltd., Kyoto (JP)

( * ) Notice: Subject to any disclaimer, the term of this patent is extended or adjusted under 35 U.S.C. 154(b) by 130 days.

(21) Appl. No.: 11/385,244

(22) Filed: Mar. 21, 2006

(65) Prior Publication Data

US 2006/0243990 A1     Nov. 2, 2006

(30) Foreign Application Priority Data

Mar. 24, 2005  (JP)  ............... 2005-086162
Apr. 20, 2005  (JP)  ............... 2005-122766
Apr. 20, 2005  (JP)  ............... 2005-122774

(51) Int. Cl.
   *H01J 40/14*   (2006.01)
(52) U.S. Cl. ................. 250/551; 250/239; 257/433
(58) Field of Classification Search ............... 250/551, 250/239; 257/81, 82, 433
   See application file for complete search history.

(56) References Cited

U.S. PATENT DOCUMENTS 5,214,495 A * 5/1993 Kitanishi .............. 257/80
5,436,742 A * 7/1995 Tanaka et al. ............ 349/25
6,677,580 B1 * 1/2004 Sano et al. .............. 250/239
2005/0056796 A1 * 3/2005 Takeuchi ................ 250/551

FOREIGN PATENT DOCUMENTS

JP     11-274550     10/1999

* cited by examiner

*Primary Examiner*—Georgia Y Epps
*Assistant Examiner*—Tony Ko
(74) *Attorney, Agent, or Firm*—Hamre, Schumann, Mueller & Larson, P.C.

(57) ABSTRACT

A light emitting element and a light receiving element are mounted on the upper surface of an insulating substrate to be laterally aligned. A cap including a first hollow portion accommodating the light emitting element, a second hollow portion accommodating the light receiving element, and a connecting portion connecting the first hollow portion and the second hollow portion to each other is provided. The connecting portion is formed with a groove in which an object to be detected is to be placed. The light emitted from the light emitting element passes across the groove to reach the light receiving element. A sealing member made of transparent resin is provided in the first hollow portion to seal the light emitting element. Another sealing member made of transparent resin is provided in the second hollow portion to seal the light receiving element.

2 Claims, 30 Drawing Sheets

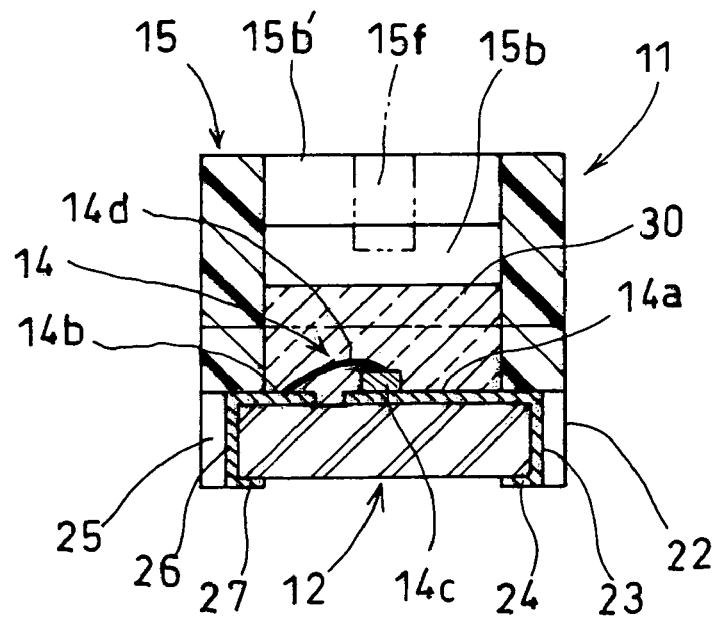
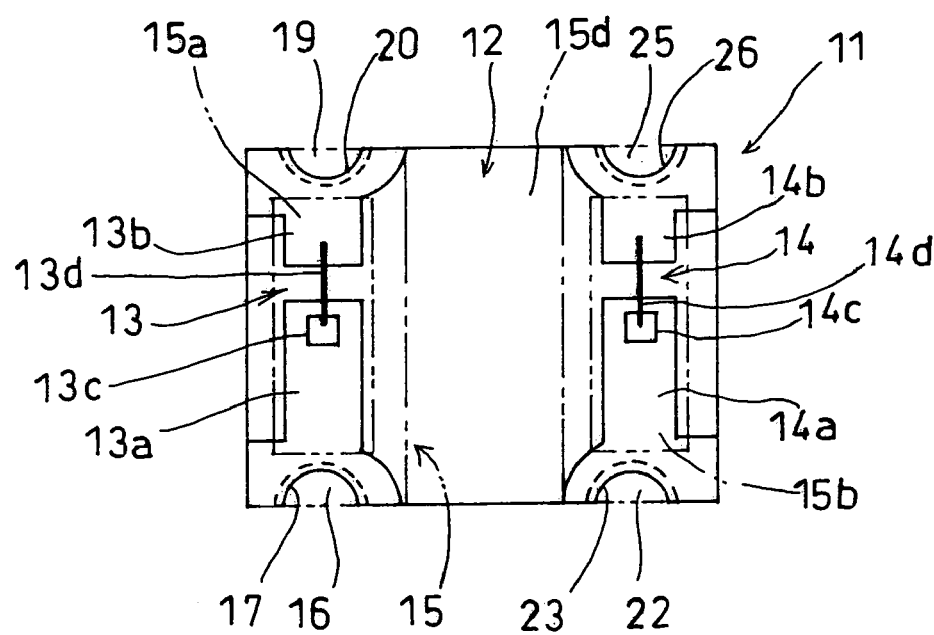

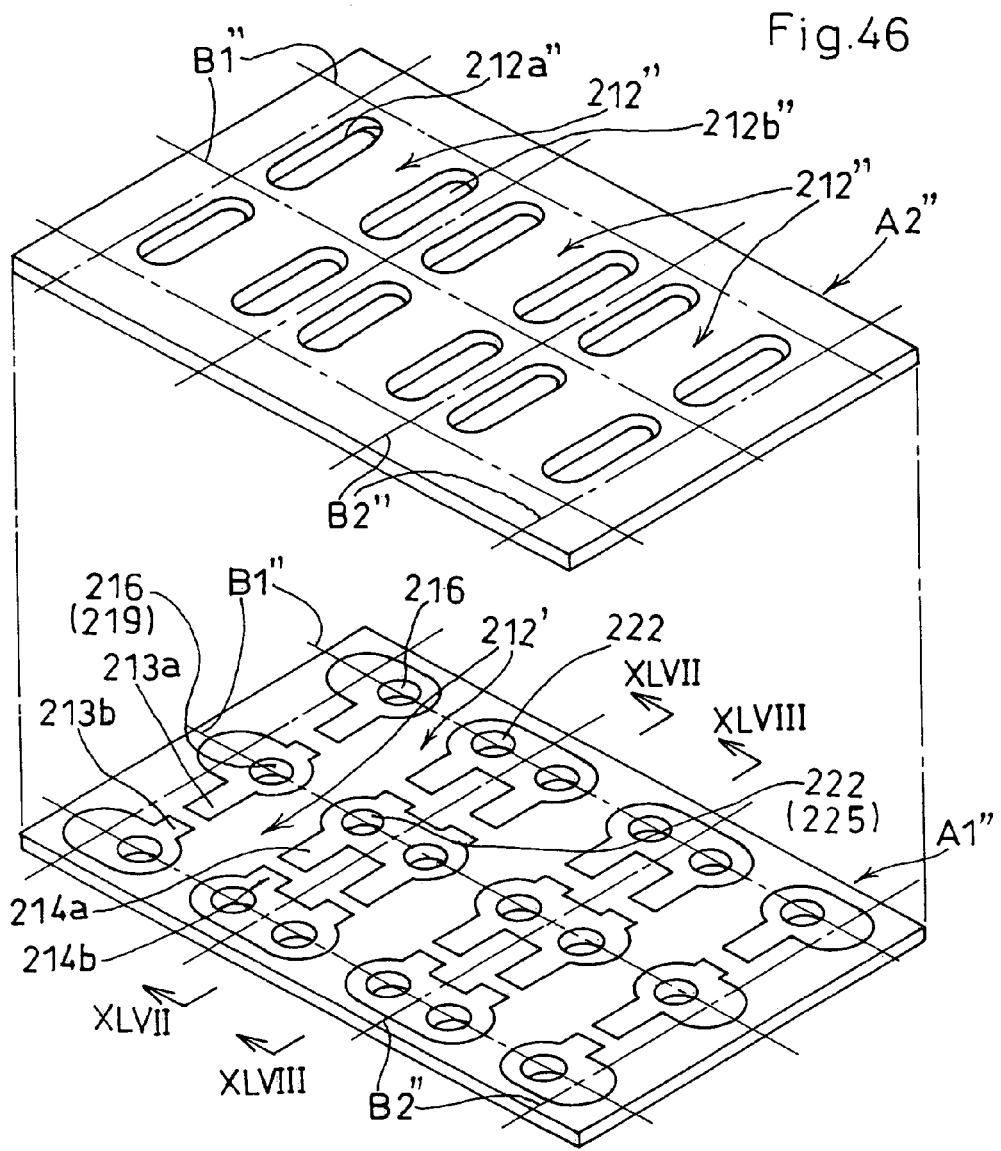
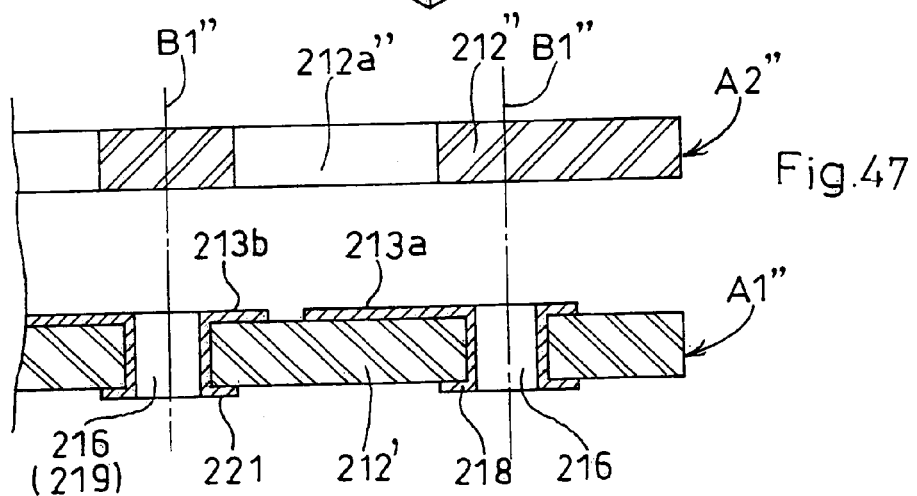

SURFACE MOUNT TYPE PHOTO INTERRUPTER AND METHOD FOR MANUFACTURING THE SAME

BACKGROUND OF THE INVENTION

1. Technical Field of the Invention

The present invention relates to a photo interrupter including a light emitting portion and a light receiving portion for detecting the presence or absence of an object therebetween. Of such photo interrupters, the present invention particularly relates to a photo interrupter of the kind which can be surface-mounted on a printed circuit board, for example. The invention further relates to a method for manufacturing such a photo interrupter.

2. Description of the Related Art

Photo interrupters utilizing a metal lead frame are conventionally known, and recently surface-mounting types, which can be fixed to a printed circuit board by soldering, has been developed.

As disclosed in JP-A-11-274550 for example, such a surface mount type photo interrupter includes an insulating substrate, and a light emitting element and a light receiving element mounted on the upper surface of an insulating substrate and hermetically sealed by respective transparent sealing members. On the lower surface of the insulating substrate, a pair of terminal electrodes for the light emitting element and a pair of terminal electrodes for the light receiving element are formed, which are utilized for surface-mounting the photo interrupter on a printed circuit board. The photo interrupter further includes a cap bonded to the upper surface of the insulating substrate. The cap includes two hollow portions respectively accommodating the light emitting element and the light receiving element sealed by the transparent sealing members, and a groove formed between the two hollow portions for receiving an object to be detected. The light emitted from the light emitting element passes across the groove of the cap to reach the light receiving element.

In this kind of photo interrupter, the light emitting element and the light receiving element of are sealed by transparent sealing members mainly for the purpose of enhancing the durability.

However, in the above-described prior-art surface mount type photo interrupter, to seal the light emitting element and the light receiving element on the insulating substrate individually by respective transparent sealing members, a transparent resin layer of a thickness capable of covering the light emitting element and the light receiving element is first formed on the entire upper surface of the insulating substrate. The transparent resin layer is then divided into a sealing member for the light emitting element and that for the light receiving element by dicing in the vertical direction and the horizontal direction.

Therefore, the sealing of the light emitting element and the light receiving element by respective sealing members requires a large number of process steps, which leads to an increase in the manufacturing cost. Further, there is a large possibility that a conductor pattern formed on the insulating substrate is damaged in the dicing in two directions, which results in a defective product.

Moreover, as noted above, in the prior-art surface mount photo interrupter, the light emitting layer and the light receiving layer are mounted on an insulating substrate and sealed by sealing members, and a cap is bonded to the insulating substrate. Since the insulating substrate has a single layer structure and hence has a relatively low rigidity, the insulating substrate may be warped or deformed due to an external force or due to the difference in thermal expansion between the sealing transparent resin and the cap.

When the insulating substrate is warped or deformed, and hence, a gap is formed between the upper surface of the insulating substrate and the cap bonded thereto, part of the light emitted from the light emitting element may leak through the gap to directly reach the light receiving element without passing across the groove in which an object to be detected is placed. In such a case, the presence or absence of the object cannot be detected precisely.

DISCLOSURE OF THE INVENTION

An object of the present invention is to provide a surface mount type photo interrupter capable of solving the above-described problems and to provide a method for manufacturing such a photo interrupter.

To achieve the above object, the surface mount type photo interrupter according to a first aspect of the present invention comprises: alight emitting element and a light receiving element mounted on the upper surface of an insulating substrate to be laterally aligned; a pair of terminal electrodes for the light emitting element and a pair of terminal electrodes for the light receiving element which are formed on the lower surface of the insulating substrate; and a cap made of an opaque material and bonded to the upper surface of the insulating substrate. The cap includes a first hollow portion accommodating the light emitting element, a second hollow portion accommodating the light receiving element, and a connecting portion connecting the first hollow portion and the second hollow portion to each other and formed with a groove for receiving an object to be detected. The cap is so designed that the light emitted from the light emitting element passes across the groove to reach the light receiving element.

The photo interrupter further includes a pair of transparent sealing members which are made of transparent resin and provided respectively in the first hollow portion and the second hollow portion of the cap to seal the light emitting element and the light receiving element. The transparent sealing members are formed by injecting transparent liquid resin and then hardening the resin in a state in which the cap is bonded to the insulating substrate.

With this structure in which the transparent sealing members for the light emitting element and the light receiving element in the first and the second hollow portions are formed by injecting transparent resin in the liquid state and then hardening the resin with the cap bonded to the insulating substrate, the sealing of the light emitting element and the light receiving element individually by respective sealing members can be performed easily without performing dicing which is necessary in the prior-art structure. Therefore, the manufacturing cost can be reduced, and damage to the conductor patterns provided on the upper surface of the insulating substrate can be avoided so that the defective products can be considerably reduced.

Further, since the transparent sealing members provided by injecting transparent resin in the liquid state into the two hollow portions contribute to the bonding of the cap to the insulating substrate, the bonding strength of the cap to the insulating substrate is enhanced.

In the surface mount type photo interrupter according to the first aspect, the cap is prepared firstly in a state without the groove at the connecting portion, and the groove is later formed by removing part of the connecting portion by machining, the part including an injection portion utilized for injecting the transparent liquid resin into the two hollow portions.

In addition to the above-described advantage, this structure is advantageous in that the injection of transparent liquid resin can be performed simultaneously with respect to the two hollow portions so that the trouble of injection can be reduced. Further, the groove for receiving an object, which is formed by machining of the connecting portion, have precisely intended dimensions and smooth inner surfaces. Therefore, a photo interrupter formed with a groove having precise dimensions and smooth inner surfaces can be provided at a relatively low manufacturing cost.

According to a second aspect of the present invention, there is provided a surface mount type photo interrupter which comprises: a light emitting element and a light receiving element mounted on the upper surface of an insulating substrate to be laterally aligned; a pair of terminal electrodes for the light emitting element and a pair of terminal electrodes for the light receiving element which are formed on the lower surface of the insulating substrate; and a cap made of an opaque material and bonded to the upper surface of the insulating substrate. The cap includes a first hollow portion accommodating the light emitting element, a second hollow portion accommodating the light receiving element, and a connecting portion connecting the first hollow portion and the second hollow portion to each other and formed with a groove for receiving an object to be detected. The cap is so designed that the light emitted from the light emitting element passes across the groove to reach the light receiving element.

The insulating substrate comprises a laminated structure of a main insulating substrate having an upper surface on which the light emitting element and the light receiving element are mounted and a lower surface on which the paired terminal electrodes for the light emitting element and the paired terminal electrodes for the light receiving element are formed, and an auxiliary insulating substrate formed with a pair of through-holes in which the light emitting element and the light receiving element on the main insulating substrate are accommodated, respectively. The photo interrupter further includes a pair of transparent sealing members which are made of transparent resin and provided respectively in the through-holes of the auxiliary insulating substrate to seal the light emitting element and the light receiving element. The transparent sealing members are formed by injecting transparent liquid resin and then hardening the resin.

With this structure, the transparent sealing members for the light emitting element and the light receiving element can be formed easily by injecting transparent liquid resin into the through-holes of the auxiliary insulating substrate and then hardening the resin. Therefore, the manufacturing cost can be reduced. Further, since damage to the conductor patterns provided on the upper surface of the insulating substrate can be reduced, the number of defective products can be considerably reduced.

Further, since the insulating substrate comprises a laminated structure provided by laminating and bonding the auxiliary insulating substrate on the main insulating substrate, the rigidity of the insulating substrate is considerably increased. Therefore, the warping or deformation of the insulating substrate due to an external force or due to the difference in thermal expansion between the sealing members and the cap can be reduced more reliably as compared with the prior-art structure in which the insulating substrate has a single layer structure.

Moreover, since the light emitting element and the light receiving element are arranged in the through-holes formed in the auxiliary insulating substrate and sealed by the transparent sealing members provided in the through-holes, the auxiliary insulating substrate reliably prevents the light emitted from the light emitting element from directly reaching the light receiving element without passing across the groove of the cap.

Thus, in the surface mount type photo interrupter according to the second aspect, the detection accuracy can be considerably improved because the warping or deformation of the insulating substrate is reduced and the travel of the light directly from the light emitting element to the light receiving element is prevented.

In the surface mount type photo interrupter of the second aspect, the main insulating substrate and the auxiliary insulating substrate may be made of the same material. In such a case, the warping or deformation due to the difference in thermal expansion between the main insulating substrate and the auxiliary insulating substrate can be prevented, which further enhances the detection accuracy.

Further, in the surface mount type photo interrupter of the second aspect, the transparent sealing members for the light emitting element and the light receiving element may be formed by injecting transparent liquid resin into the two hollow portions and then hardening the resin. With such a structure, the light emitting element and the light receiving element can be sealed perfectly, and the bonding strength of the cap to the insulating substrate is increased.

According to a third aspect of the present invention, there is provided a method for manufacturing a surface mount type photo interrupter comprising the steps of: preparing an insulating substrate; mounting a light emitting element and a light receiving element on an upper surface of the insulating substrate so that the light emitting element and the light receiving element are laterally aligned; forming a pair of terminal electrodes for the light emitting element and a pair of terminal electrodes for the light receiving element on a lower surface of the insulating substrate; preparing an opaque cap including a first hollow portion, a second hollow portion, and a connecting portion connecting the first hollow portion and the second hollow portion to each other and formed with a groove for receiving an object to be detected; bonding the cap to the upper surface of the insulating substrate so that the light emitting element and the light receiving element are accommodated in the first hollow portion and the second hollow portion, respectively; and forming a pair of transparent sealing members respectively for sealing the light emitting element and the light receiving element by injecting transparent liquid resin into the first hollow portion and the second hollow portion of the cap and then hardening the resin.

In the manufacturing method according to the third aspect, the cap preparation step comprises preparing a cap firstly in a state without the groove at the connecting portion, the sealing member forming step comprises injecting the transparent liquid resin into the two hollow portions through part of the connecting portion, and the cap preparation step further comprises removing the part of the connecting portion by machining to form the groove after the transparent liquid resin is injected and hardened.

By the manufacturing method according to the third aspect, the surface mount type photo interrupters according to the first aspect can be manufactured.

According to a fourth aspect of the present invention, there is provided a method for manufacturing a surface mount type photo interrupter comprising the steps of: preparing a main insulating substrate and an auxiliary insulating substrate; mounting a light emitting element and a light receiving element on an upper surface of the main insulating substrate so that the light emitting element and the light receiving element are laterally aligned; forming a pair of terminal electrodes for the light emitting element and a pair of terminal electrodes for the light receiving element on a lower surface of the main insulating substrate; preparing an opaque cap including a first hollow portion, a second hollow portion, and a connecting portion connecting the first hollow portion and the second hollow portion to each other and formed with a groove for receiving an object to be detected; laminating and bonding the auxiliary insulating substrate on the upper surface of the main insulating substrate so that the light emitting element and the light receiving element are accommodated in through-holes formed in the auxiliary insulating substrate; forming a pair of transparent sealing members respectively for sealing the light emitting element and the light receiving element by injecting transparent liquid resin into the through-holes of the auxiliary insulating substrate and then hardening the resin; and bonding the cap to the upper surface of the main insulating substrate so that the light emitting element and the light receiving element are accommodated in the first hollow portion and the second hollow portion, respectively.

In the manufacturing method according to the fourth aspect, the sealing member forming step may comprise injecting transparent liquid resin into the two hollow portions after the cap bonding step.

With the above manufacturing methods according to the fourth aspect, the surface mount type photo interrupters according to the second aspect can be manufactured.

According to a fifth aspect of the present invention, there is provided a method for manufacturing a surface mount type photo interrupter comprising the steps of: preparing a material board consisting of a plurality of insulating substrate regions each of which is to be used for an insulating substrate of a photo interrupter; mounting a light emitting element and a light receiving element on an upper surface of each of the insulating substrate regions of the material board, and forming a pair of terminal electrodes for the light emitting element and a pair of terminal electrodes for the light receiving element on a lower surface of each of the insulating substrate regions of the material board; preparing an opaque cap including a first hollow portion, a second hollow portion, and a connecting portion connecting the first hollow portion and the second hollow portion to each other and formed with a groove for receiving an object to be detected; bonding the cap to the upper surface of each of the insulating substrate regions of the material board so that the light emitting element and the light receiving element are accommodated in the first hollow portion and the second hollow portion, respectively; forming a pair of transparent sealing members respectively for sealing the light emitting element and the light receiving element by injecting transparent liquid resin into the first hollow portion and the second hollow portion of each of the caps and then hardening the resin; and dividing the material board into individual insulating substrates by dicing along a vertical cutting line and dicing along a horizontal cutting line.

In the manufacturing method according to the fifth aspect, the cap preparation step may comprise preparing a cap firstly in a state without the groove at the connecting portion, the sealing member forming step may comprise injecting the transparent liquid resin into the two hollow portions through part of the connecting portion, and the cap preparation step may further comprise removing the part of the connecting portion by machining to form the groove after the transparent liquid resin is injected and hardened.

With the manufacturing method according to the fifth aspect, a plurality of surface mount type photo interrupter having the structure according to the first aspect can be obtained simultaneously from a singe material board. Therefore, the manufacturing cost can be considerably reduced.

According to a sixth aspect of the present invention, there is provided a method for manufacturing a surface mount type photo interrupter comprising the steps of: preparing a main material board consisting of a plurality of main insulating substrate regions each of which is to be used for a main insulating substrate of a photo interrupter; preparing a sub material board consisting of a plurality of auxiliary insulating substrate regions each of which is to be used for an auxiliary insulating substrate of a photo interrupter; mounting a light emitting element and a light receiving element on an upper surface of each of the main insulating substrate regions of the main material board so that the light emitting element and the light receiving element are laterally aligned; forming a pair of terminal electrodes for the light emitting element and a pair of terminal electrodes for the light receiving element on a lower surface of each of the main insulating substrate regions of the main material board; preparing an opaque cap including a first hollow portion, a second hollow portion, and a connecting portion connecting the first hollow portion and the second hollow portion to each other and formed with a groove for receiving an object to be detected; obtaining a material board laminated structure by laminating and bonding the sub material board on the upper surface of the main material board so that the light emitting element and the light receiving element are received in through-holes formed in each of the auxiliary insulating substrate regions of the sub material board; forming a pair of transparent sealing members respectively for sealing the light emitting element and the light receiving element by injecting transparent liquid resin into the through-holes of the sub material board and then hardening the resin; bonding the cap to the upper surface of each of the main insulating substrate regions of the main material board so that the light emitting element and the light receiving element are accommodated in the first hollow portion and the second hollow portion, respectively; and dividing the material board laminated structure into individual insulating substrates by dicing along a vertical cutting line and dicing along a horizontal cutting line.

In the manufacturing method according to the sixth aspect, the sealing member forming step may comprise injecting transparent liquid resin into the two hollow portions after the cap bonding step.

With the manufacturing methods according to the sixth aspect, a plurality of surface mount type photo interrupters having the structure according to the second aspect can be obtained simultaneously from a singe material board. Therefore, the manufacturing cost can be considerably reduced.

Further, in the manufacturing method according to the fifth and the sixth aspect, the cap preparation step may comprise preparing a cap material board consisting of a plurality of cap regions and dividing the cap material board into a plurality of individual caps by dicing. In such a case, a plurality of caps can be formed and bonded to the material board simultaneously. Therefore, the trouble of forming and bonding the cap can be reduced, which leads to a reduction in the manufacturing cost.

Other objects, features and advantages of the present invention will become apparent from the description of embodiments given below with reference to the accompanying drawings.

BRIEF DESCRIPTION OF THE DRAWINGS

FIG. 3 is a sectional view taken along lines III-III in FIG. 1.

FIG. 4 is a sectional view taken along lines IV-IV in FIG. 1.

FIG. 46 is a perspective view showing a main material board and a sub material board.

FIG. 47 is an enlarged sectional view taken along lines XLVII-XLVII in FIG. 46.

DETAILED DESCRIPTION OF THE PREFERRED EMBODIMENTS

1. First Embodiment

Figure 1:
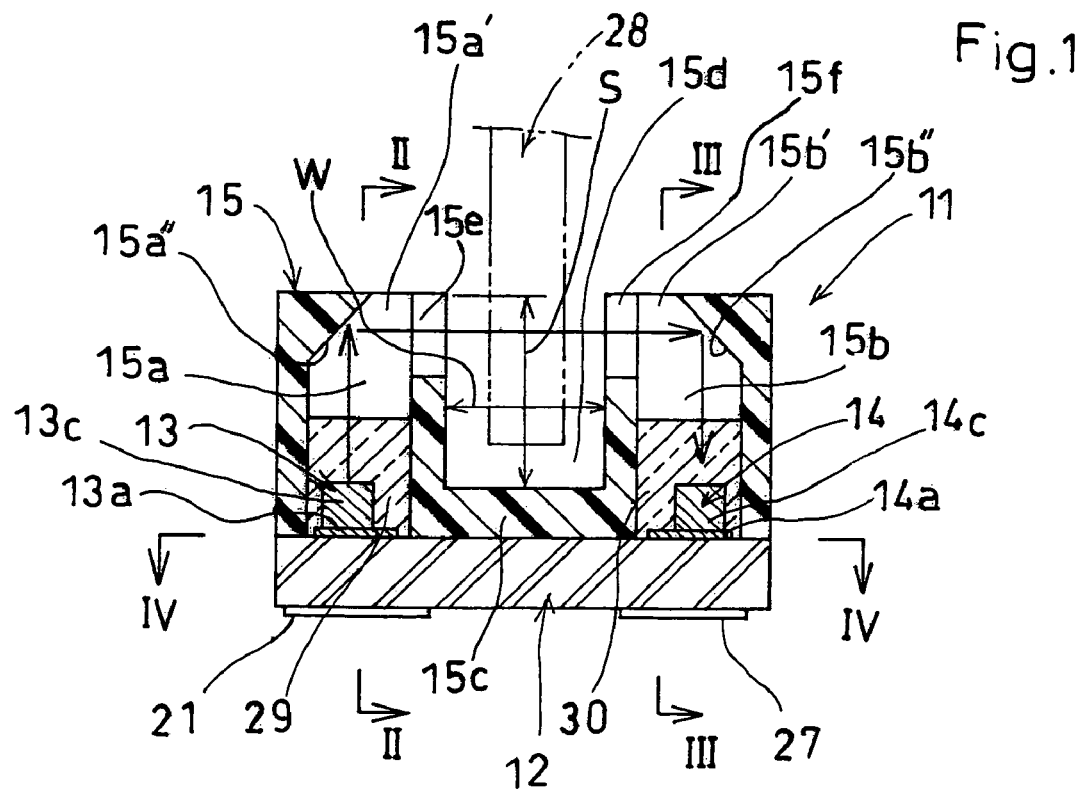
FIG. 1 is a sectional view showing a surface mount type photo interrupter of a first embodiment.
Figure 2:
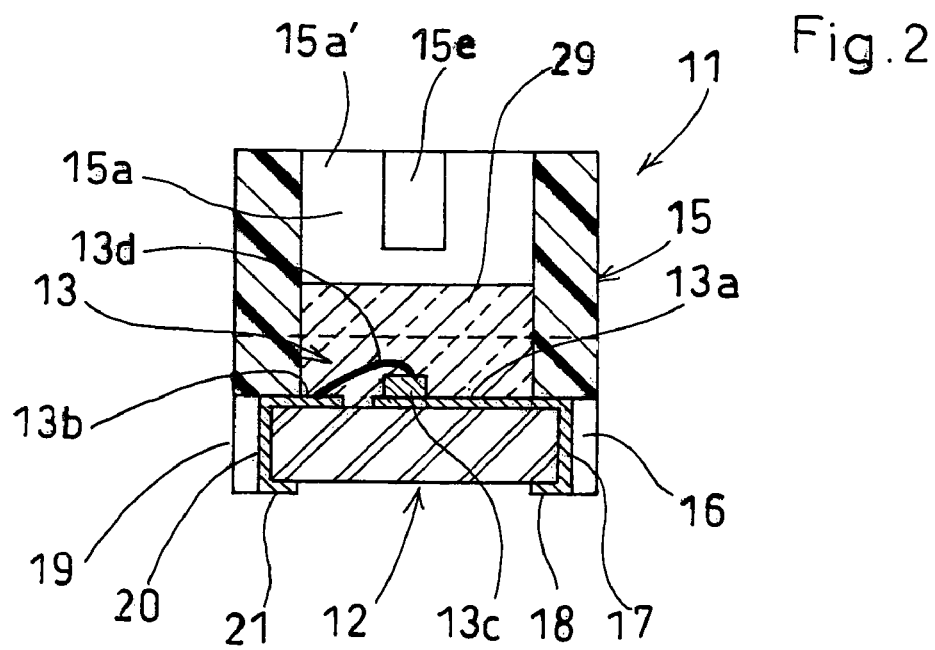
FIG. 2 is a sectional view taken along lines II-II in FIG. 1.
Figure 5:
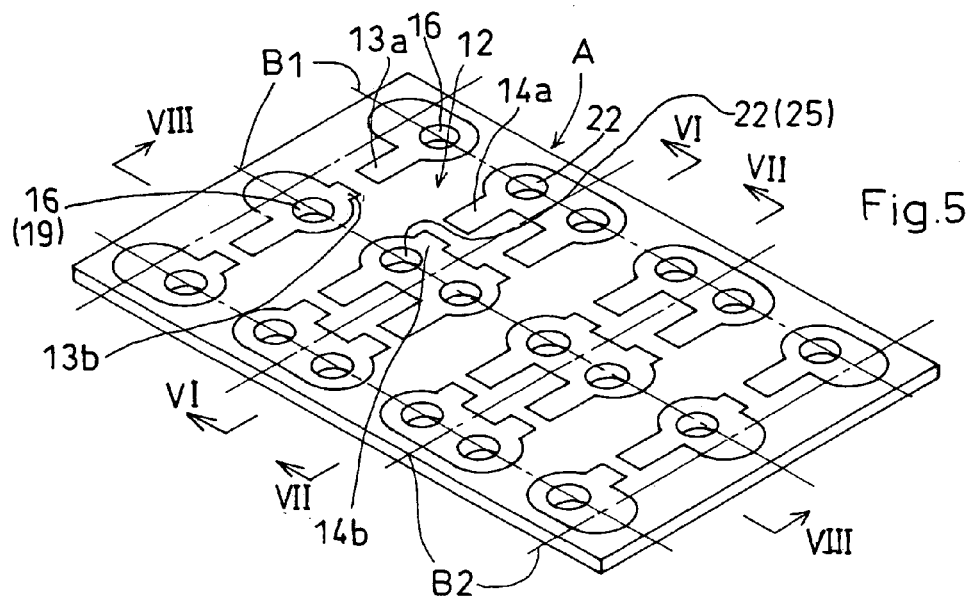
FIG. 5 is a perspective view showing a material board for manufacturing the photo interrupter of the first embodiment.
Figure 6:
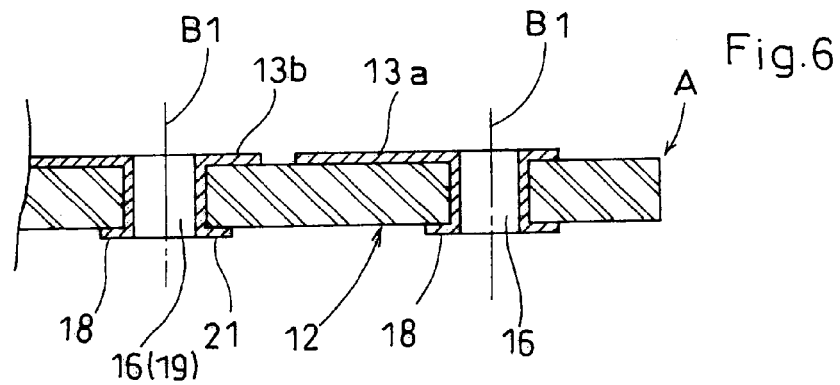
FIG. 6 is an enlarged sectional view taken along lines VI-VI in FIG. 5.
Figure 7:
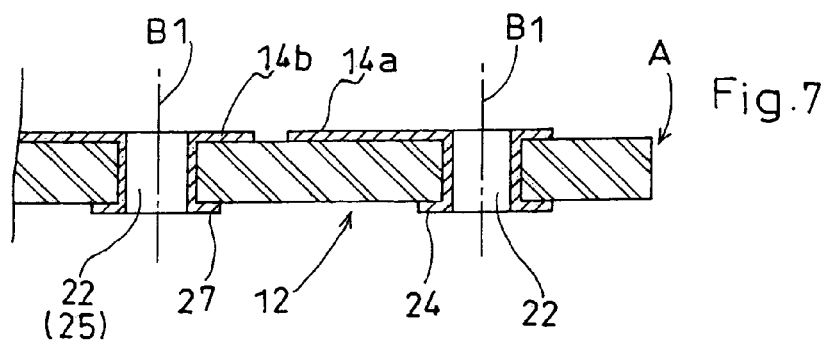
FIG. 7 is an enlarged sectional view taken along lines VII-VII in FIG. 5.
Figure 8:
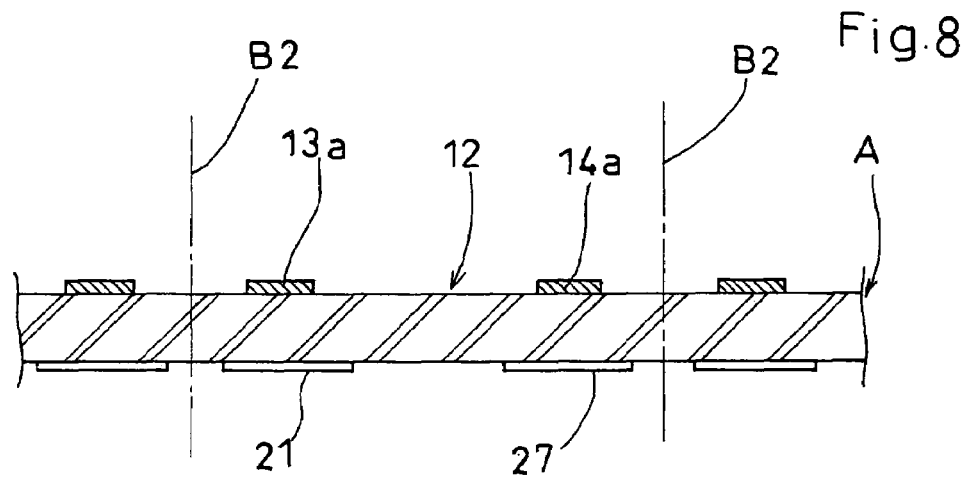
FIG. 8 is an enlarged sectional view taken along lines VIII-VIII in FIG. 5.

FIGS. 1-4 show a surface mount type photo interrupter 11 according to a first embodiment of the present invention.

The surface mount type photo interrupter 11 comprises an insulating substrate 12 made of a heat-resistant insulating material such as glass epoxy, a light emitting element 13 and a light receiving element 14 which are mounted on the upper surface of the insulating substrate 12 to be laterally spaced from each other, and a cap 15 made of opaque synthetic resin and bonded to the upper surface of the insulating substrate 12.

The light emitting element 13 on the upper surface of the insulating substrate 12 comprises a pair of conductor patterns 13a and 13b, a light emitting diode chip 13c die-bonded to the conductor pattern 13a, and a metal wire 13d connecting the light emitting diode chip 13c and the conductor pattern 13b by wire bonding.

The light receiving element 14 on the upper surface of the insulating substrate 12 comprises a pair of conductor patterns 14a and 14b, a light receiving chip 14c such as a phototransistor die-bonded to the conductor pattern 14a, and a metal wire 14d connecting the light receiving diode chip 14c and the conductor pattern 14b by wire bonding.

The lower surface of the insulating substrate 12 is formed, on the light emitting element 13 side, with a terminal electrode 18 electrically connected to the conductor pattern 13a of the light emitting element 13 via a conductor 17 provided in a through-hole 16, and a terminal electrode 21 connected to the conductor pattern 13b of the light emitting element 13 via a conductor 20 provided in a through-hole 19. The lower surface of the insulating substrate 12 is further formed, on the light receiving element 14 side, with a terminal electrode 24 electrically connected to the conductor pattern 14a of the light receiving element 14 via a conductor 23 provided in a through-hole 22, and a terminal electrode 27 electrically connected to the conductor pattern 14b of the light receiving element 14 via a conductor 26 provided in a through-hole 25.

The cap 15 includes a first hollow portion 15a accommodating the light emitting element 13 and having an upper surface formed with an opening 15a', and a second hollow portion 15b accommodating the light receiving element 14 and having an upper surface formed with an opening 15b', and a connecting portion 15c integrally connecting the two hollow portions 15a and 15b to each other. On the connecting portion 15c, a groove 15d having an inner width W and a depth S is formed, in which an object 28 to be detected is to be placed.

The cap 15 is so structured that the light emitted from the light emitting element 13 in the first follow portion 15a is reflected at a reflection surface 15a" in the first hollow portion 15a to travel horizontally through a slit 15e and across the groove 15d. The light then enters the second hollow portion 15b through another slit 15f and is reflected at a reflection surface 15b" in the second hollow portion 15b to travel downward to reach the light receiving element 14.

In the first hollow portion 15a of the cap 15, a transparent sealing member 29 is provided to hermetically seal the light emitting element 13. The sealing member is formed by injecting transparent liquid resin into the first hollow portion 15a through the opening 15a' and then hardening the resin. In the second hollow portion 15b of the cap 15, a transparent sealing member 30 is provided to hermetically seal the light receiving element 14. The sealing member is formed by injecting transparent liquid resin into the second hollow portion 15b through the opening 15b' and then hardening the resin.

The photo interrupter 11 having the above-described structure can be mounted on e.g. a printed circuit board in various kinds of electrical apparatus by soldering the terminal electrodes 18, 21, 24 and 27 provided on the lower surface of the insulting substrate 12.

In the mounted state, when an object 28 does not exist in the groove 15c, the light emitted from the light emitting element 13 travels across the groove 15d to reach the light receiving element 14. However, when the object 28 exists in the groove 15d, the light traveling toward the light receiving element 14 is blocked by the object 28. In this way, the presence or absence of the object 28 in the groove 15d is detected.

As noted above, the transparent sealing members 29 and 30 in the cap 15 for sealing the light emitting element 13 in the first hollow portion 15a and the light receiving element 14 in the second hollow portion 15b, respectively, are formed by injecting transparent liquid resin into the hollow portions 15a and 15b through the openings 15a' and 15b' and then hardening the resin. Therefore, the light emitting element 13 and the light receiving element 14 can be easily sealed individually by respective sealing members 29 and 30 without performing dicing which is necessary for the prior art structure.

The injection of transparent liquid resin into the hollow portions 15a and 15b may be performed through the slits 15e and 15f opening toward the groove 15d.

A method for manufacturing the surface mount type photo interrupter 11 having the above-described structure of the first embodiment will be described below.

First, as shown in FIGS. 5-8, a material board A including a plurality of regions which are later to become insulating substrates 12 and which are integrally arranged in a matrix is prepared using a heat-resistant insulating material such as glass epoxy.

The material board A is later to be cut into individual insulating substrates 12 by dicing along the vertical cutting lines B1 and the horizontal cutting lines B2 as will be described later in detail. With respect to each of the regions to become insulating substrates 12, conductor patterns 13a, 13b, 14a and 14b are formed on the upper surface, terminal electrodes 18, 21, 24 and 27 are formed on the lower surface, through-holes 16, 19, 22 and 25 are formed to penetrate therethrough, and conductors 17, 20, 23 and 26 are formed in the through-holes.

Figure 9:
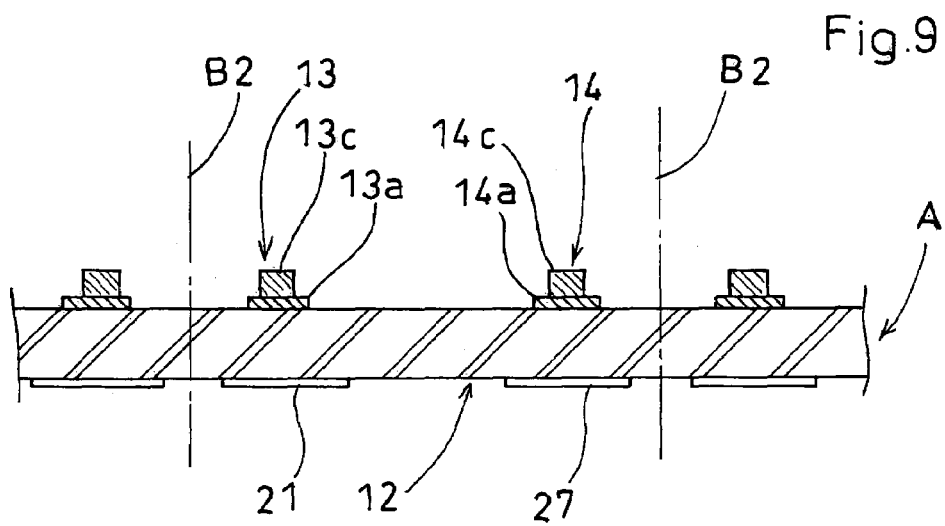
FIG. 9 is a sectional view showing the state in which a light emitting element and a light receiving element are mounted in the first embodiment.

Subsequently, as shown in FIG. 9, a light emitting element 13 and a light receiving element 14 are mounted on each of the regions of the material board A which are to become insulating substrates 12. Specifically, die bonding of chips 13c and 14c and wire bonding using metal wires 13d and 14d are performed.

Figure 10:
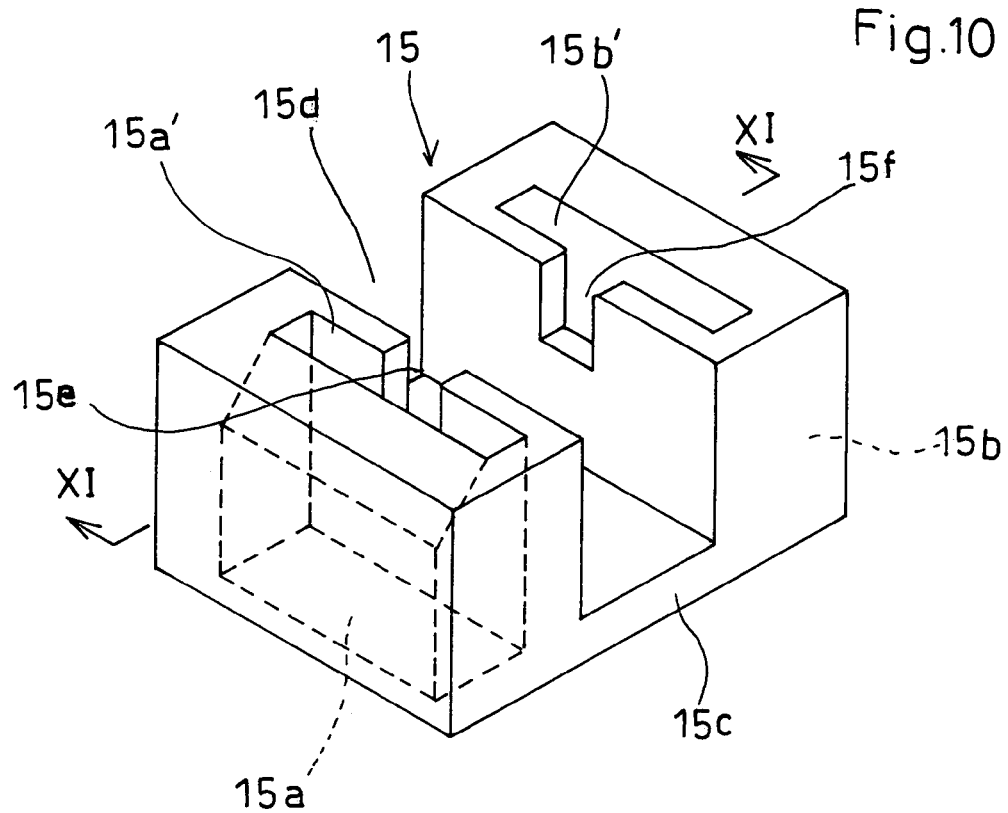
FIG. 10 is a perspective view showing a cap of the first embodiment.
Figure 11:
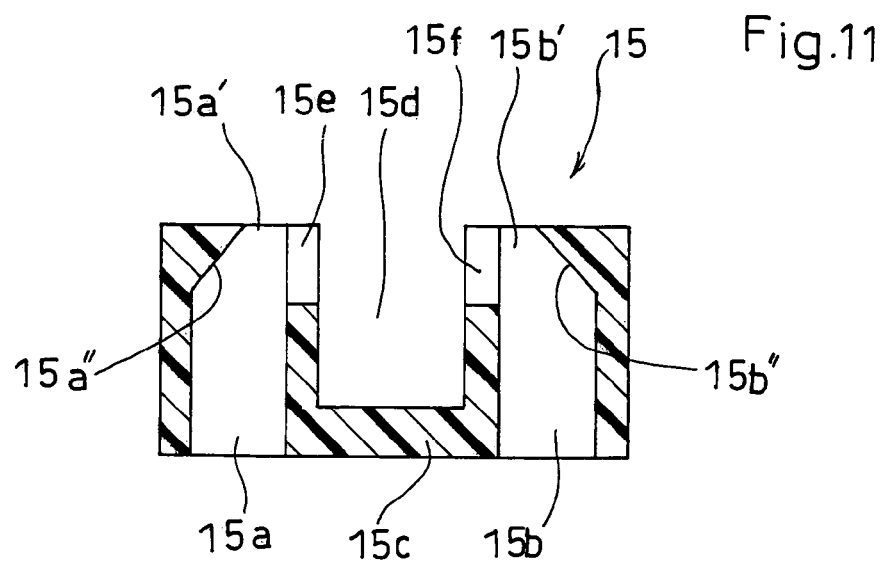
FIG. 11 is a sectional view taken along XI-XI in FIG. 10.

Meanwhile, as shown in FIGS. 10 and 11, a cap 15 having the above-described structure is prepared by using opaque synthetic resin.

Figure 12:
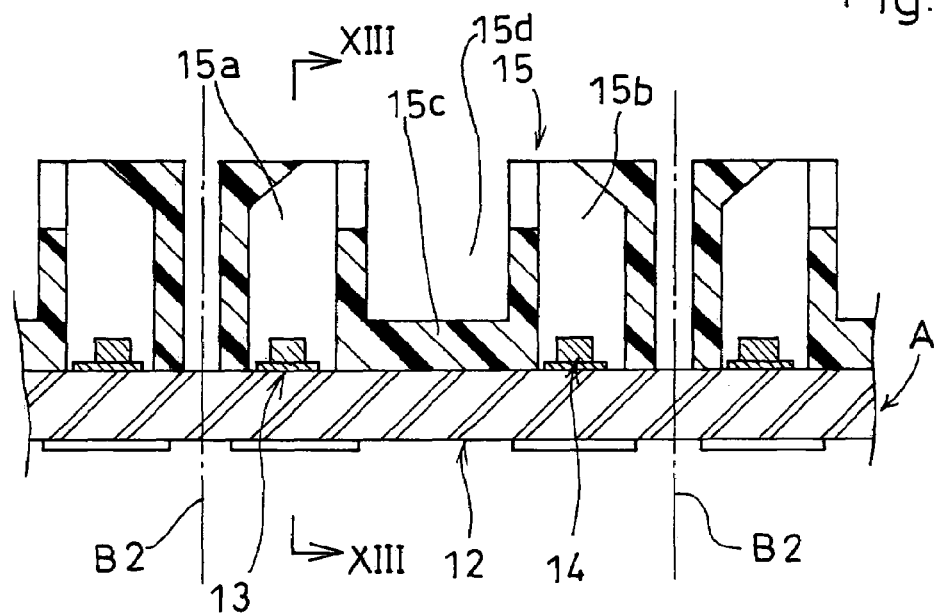
FIG. 12 is a sectional view showing the state in which a cap is bonded in the first embodiment.
Figure 13:
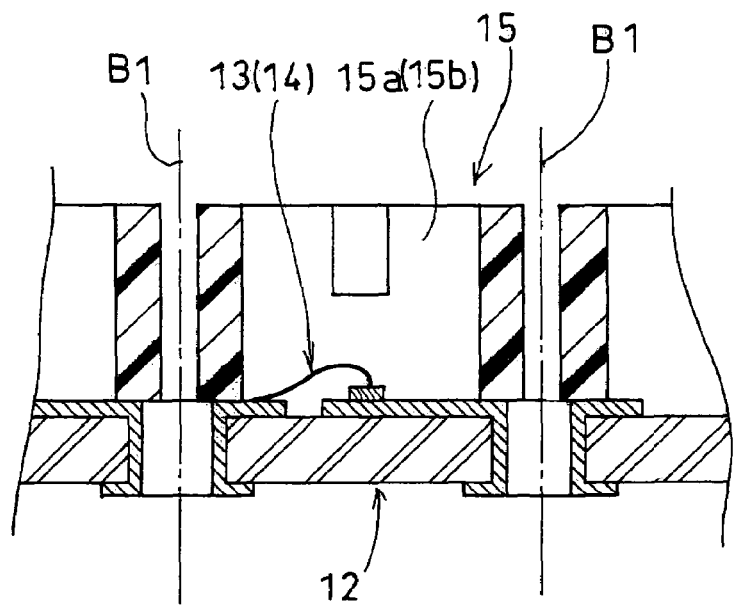
FIG. 13 is a sectional view taken along lines XIII-XIII in FIG. 12.

Subsequently, as shown in FIGS. 12 and 13, the cap 15 is supplied onto each of the regions of the material board A which are to become insulating substrates 12 and bonded thereto by using a non-illustrated adhesive, for example.

Figure 14:
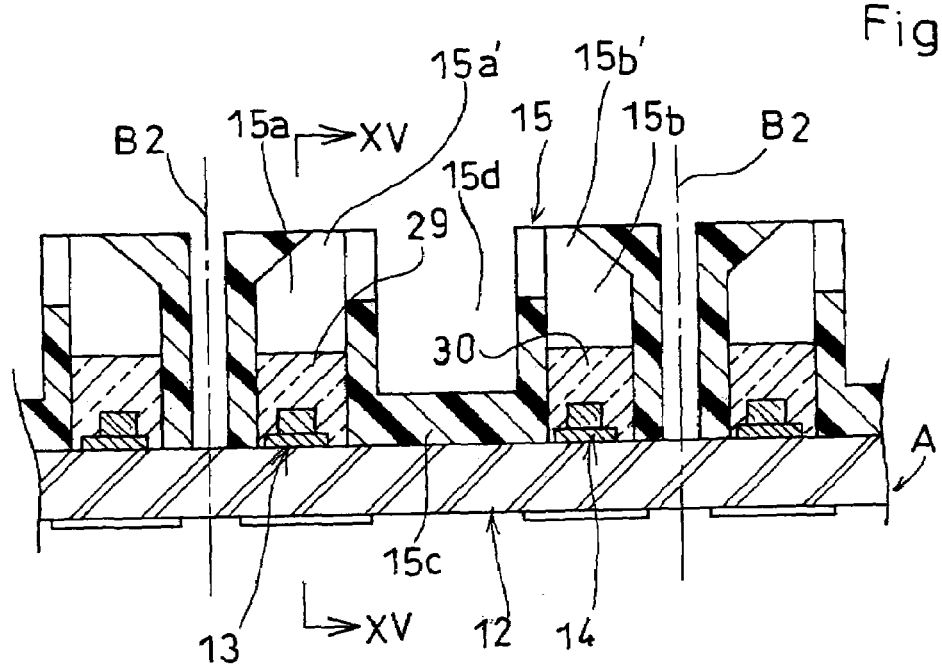
FIG. 14 is a sectional view showing the state in which a transparent sealing member is provided in the first embodiment.
Figure 15:
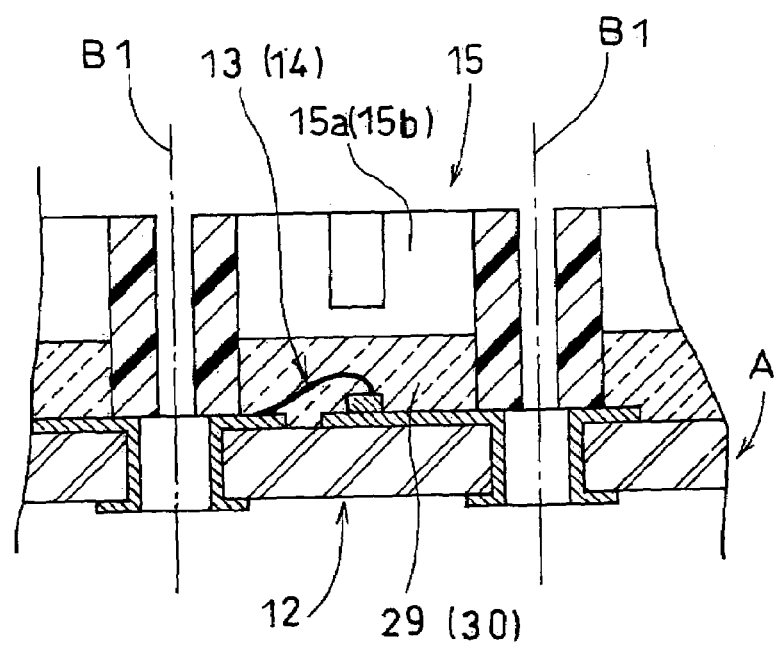
FIG. 15 is a sectional view taken along lines XV-XV in FIG. 14.

Then, transparent resin in the liquid state is injected into the hollow portions 15a and 15b of the cap 15 through the openings 15a' and 15b' or the slits 15e and 15f and then hardened by drying, for example. In this way, as shown in FIGS. 14 and 15, transparent sealing members 29 and 30 sealing the light emitting element 13 and the light receiving element 14 are formed in the first hollow portion 15a and the second hollow portion 15b, respectively.

Figure 16:
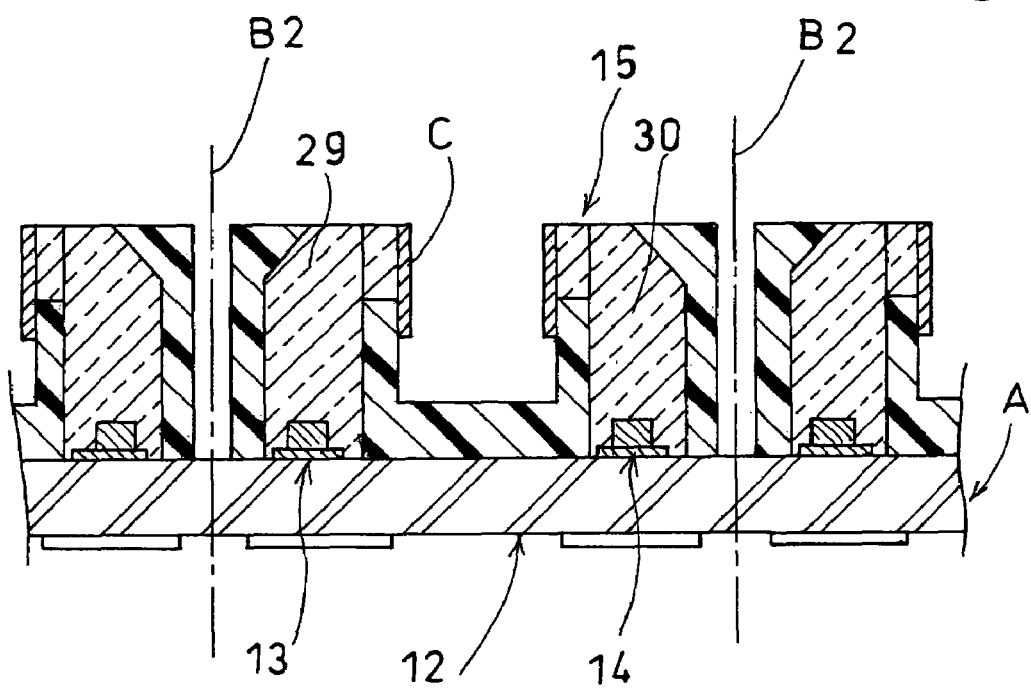
FIG. 16 is a sectional view showing a variation of the structure shown in FIG. 14.

As shown in FIG. 16, in forming the transparent sealing members 29 and 30, the transparent liquid resin may be injected to fill the hollow portions 15a and 15b, with the slits 15d and 15e closed using removable tape C, for example.

Figure 17:
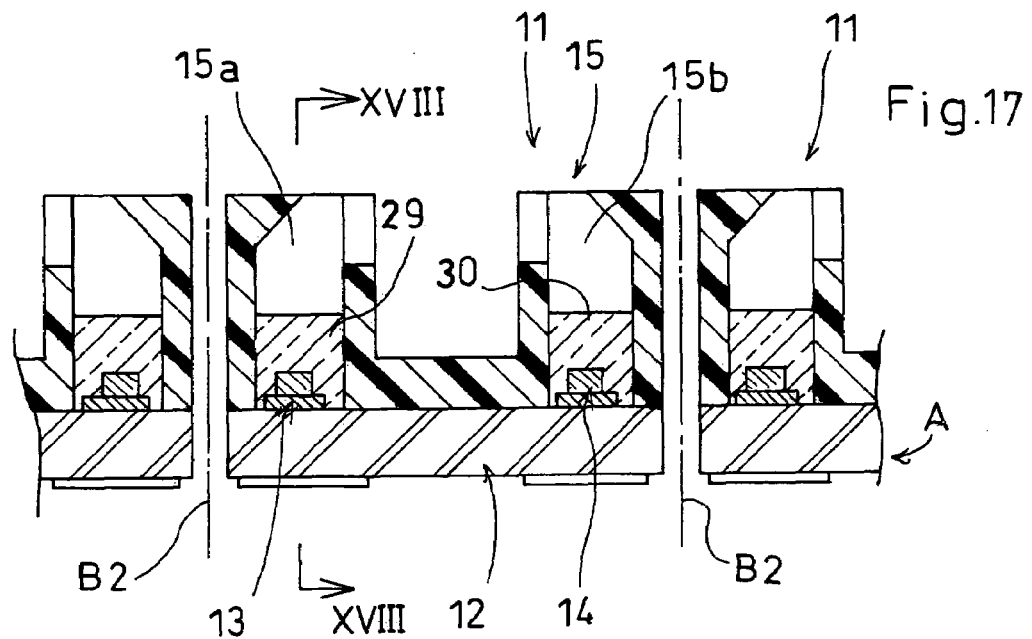
FIG. 17 is a sectional view showing the photo interrupter obtained by division in the first embodiment.
Figure 18:
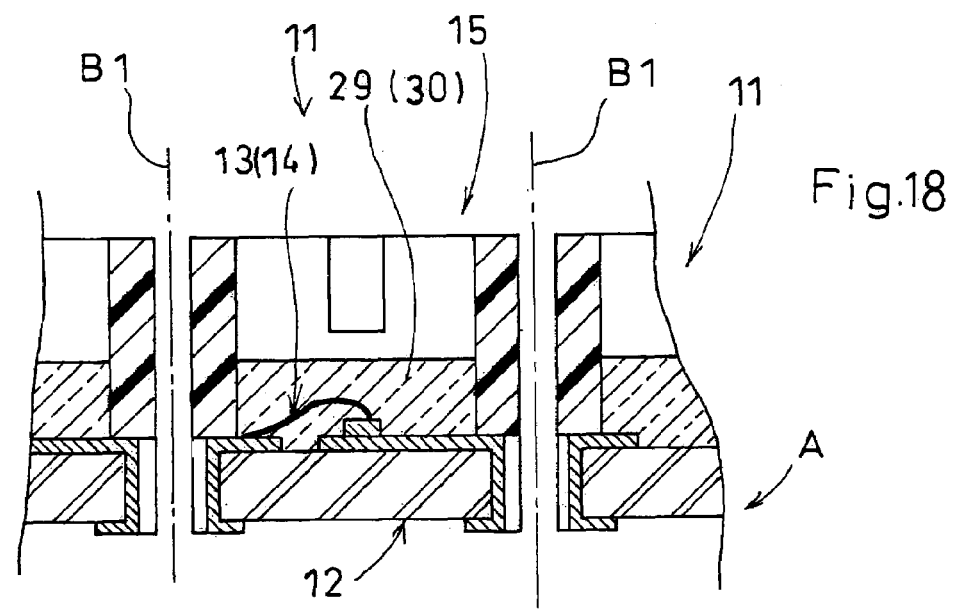
FIG. 18 is a sectional view taken along lines XVIII-XVIII in FIG. 17.

Subsequently, as shown in FIGS. 17 and 18, the material board A is cut along the vertical cutting lines B1 and the horizontal cutting lines B2 by dicing. In this way, a plurality of surface mount type photo interrupters 11 each having the structure as shown in FIGS. 1-4 are simultaneously obtained.

Figure 19:
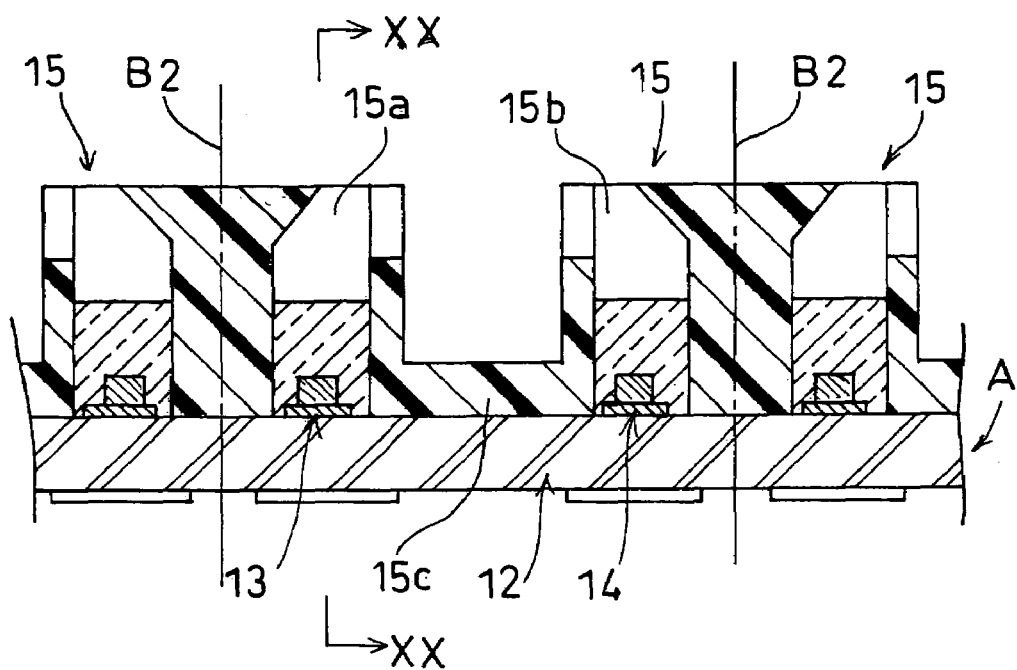
FIG. 19 is a sectional view showing another manufacturing method of the first embodiment.
Figure 20:
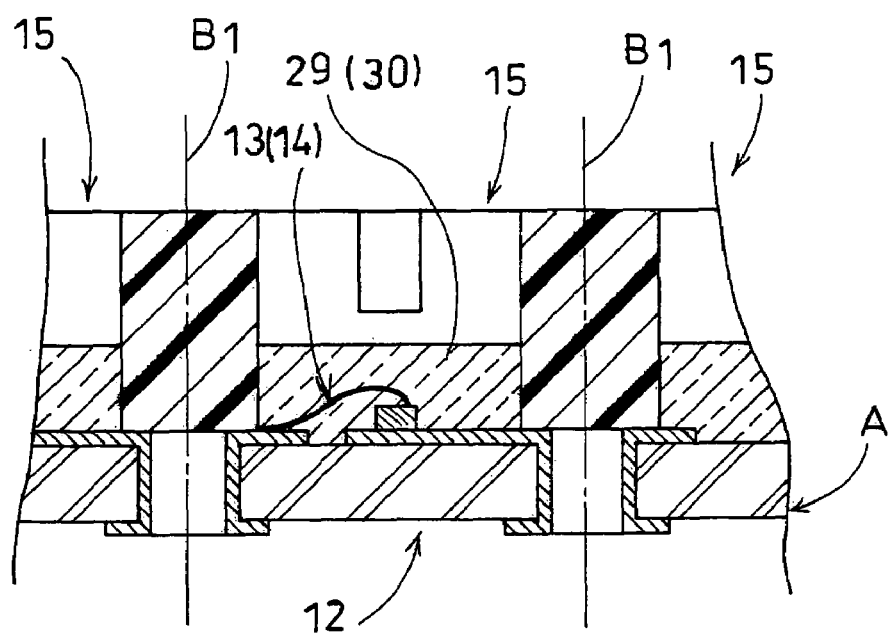
FIG. 20 is a sectional view taken along lines XX-XX in FIG. 19.
Figure 21:
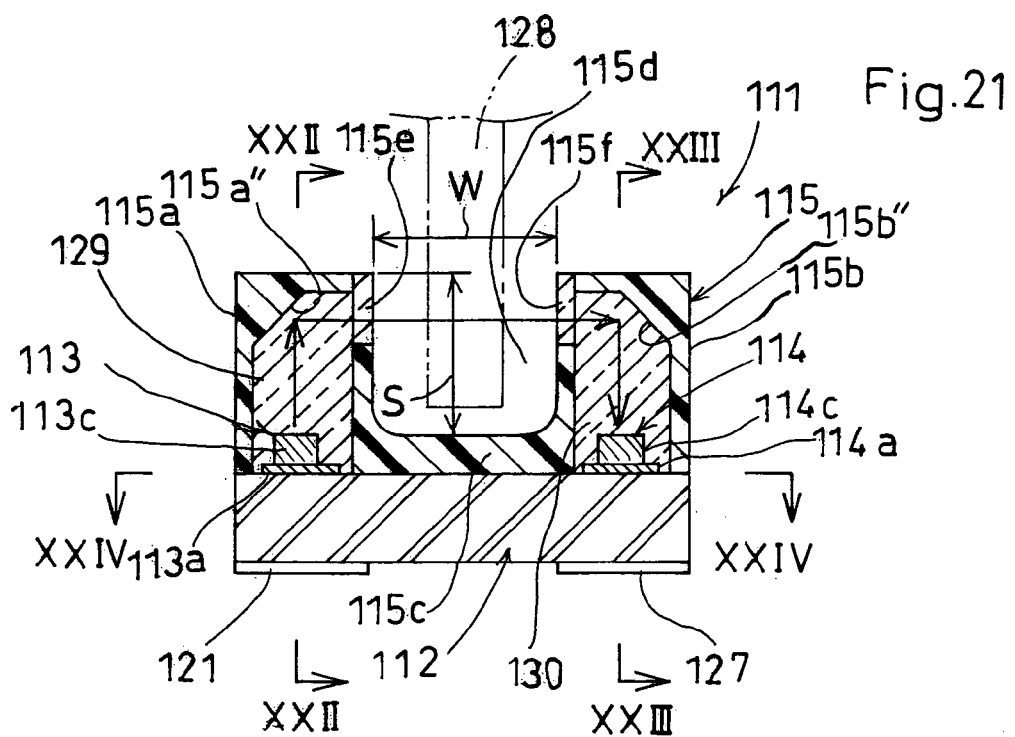
FIG. 21 is a sectional view showing a surface mount type photo interrupter of a second embodiment.
Figure 22:
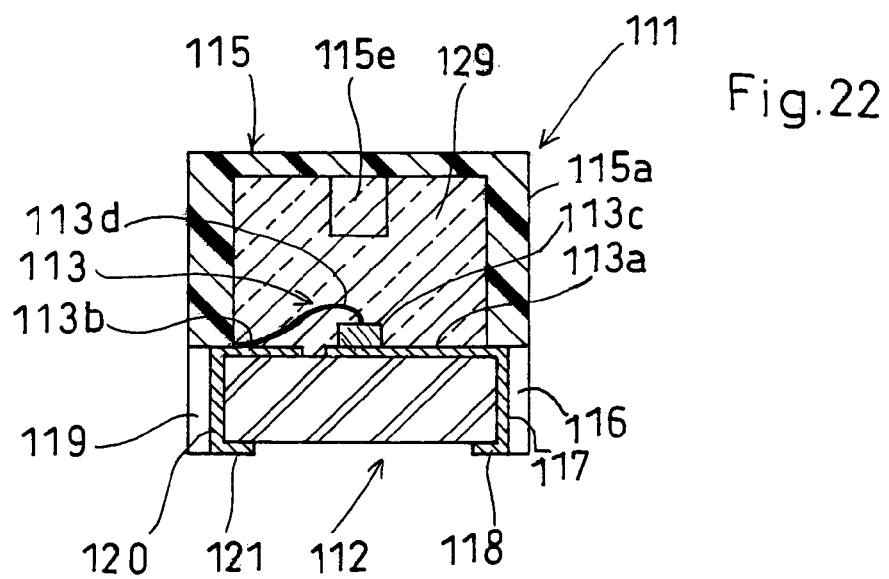
FIG. 22 is a sectional view taken along lines XXII-XXII in FIG. 21.
Figure 23:
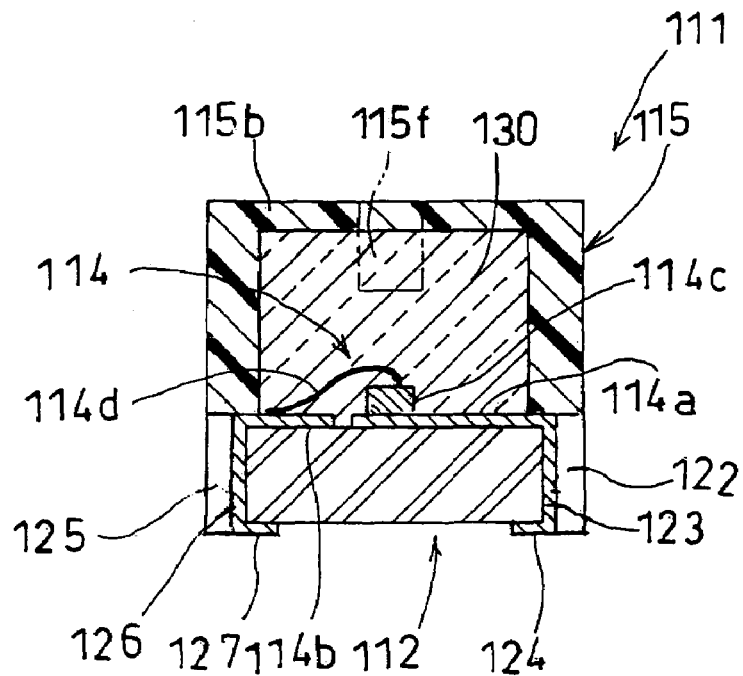
FIG. 23 is a sectional view taken along lines XXIII-XXIII in FIG. 21.
Figure 24:
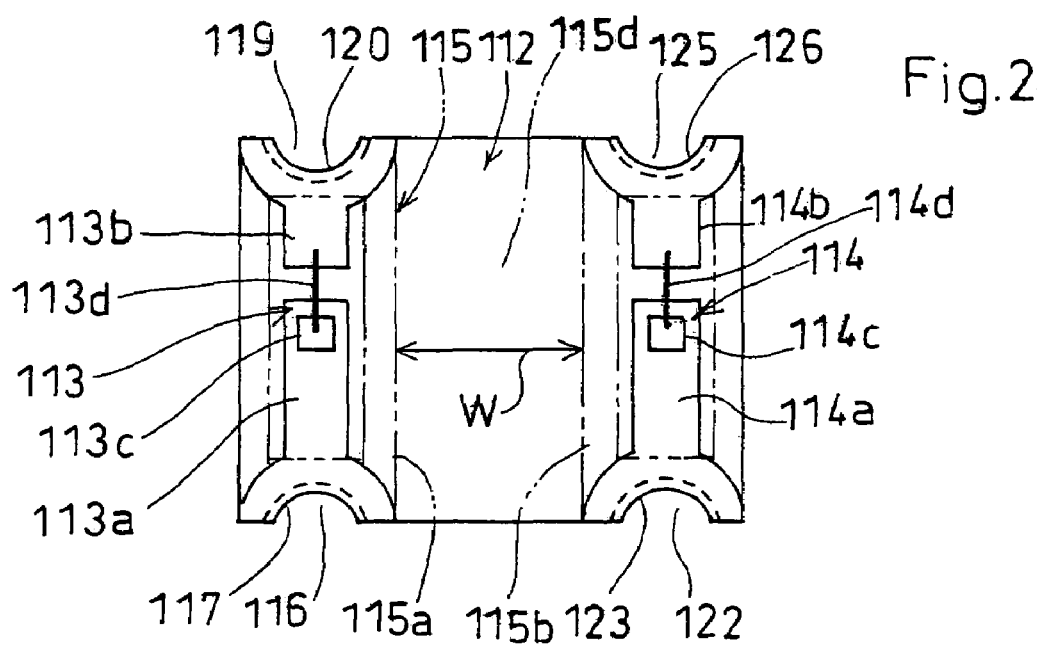
FIG. 24 is a sectional view taken along lines XXIV-XXIV in FIG. 21.
Figure 25:
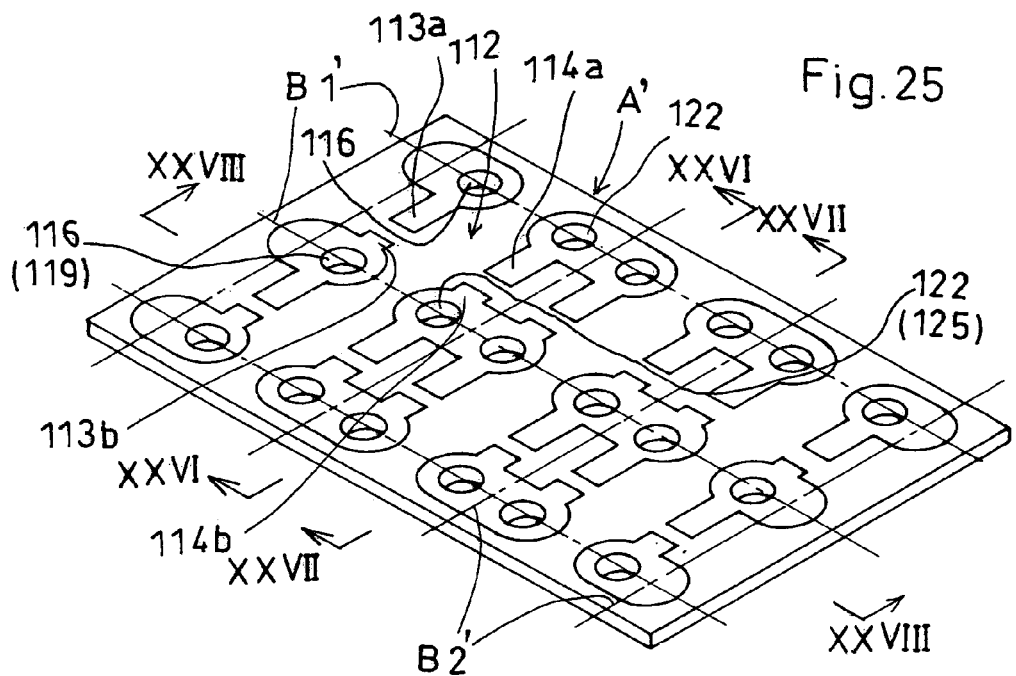
FIG. 25 is a perspective view showing a material board for manufacturing the photo interrupter of the second embodiment.
Figure 26:
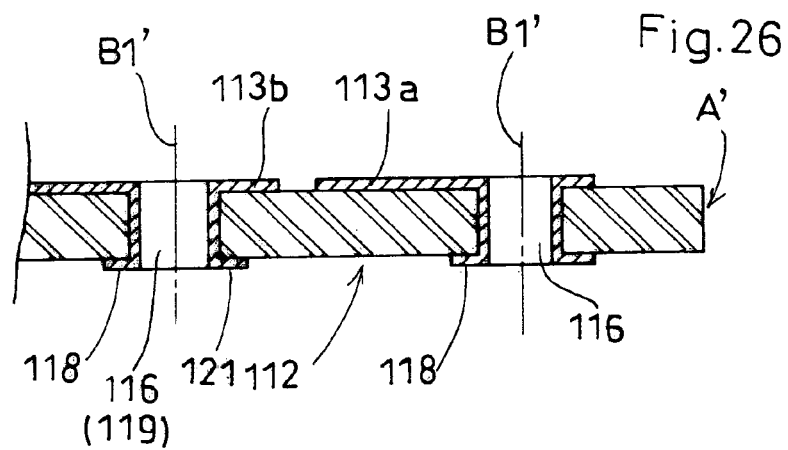
FIG. 26 is an enlarged sectional view taken along lines XXVI-XXVI in FIG. 25.
Figure 27:
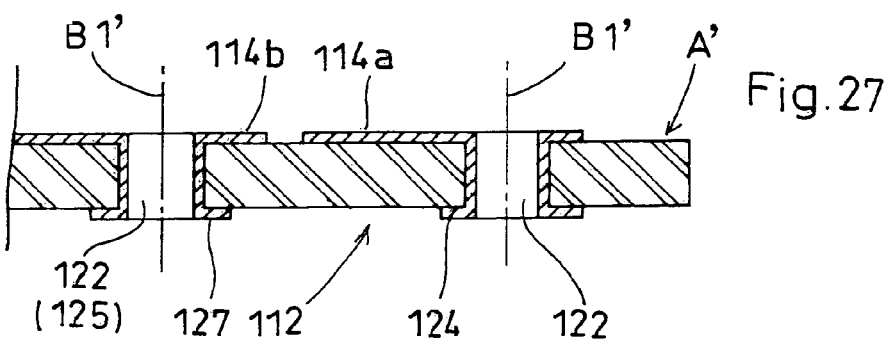
FIG. 27 is an enlarged sectional view taken along lines XXVII-XXVII in FIG. 25.
Figure 28:
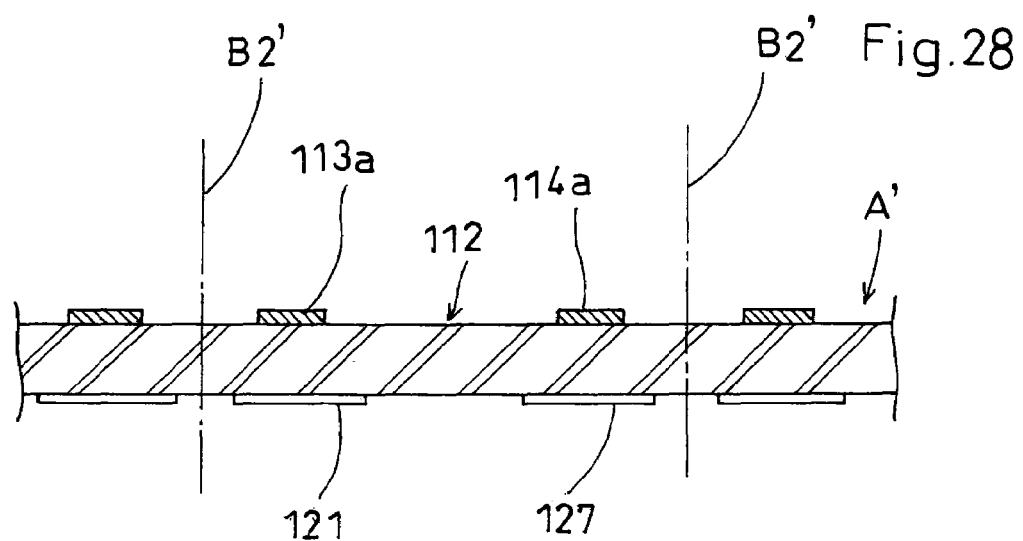
FIG. 28 is an enlarged sectional view taken along lines XXVIII-XXVIII in FIG. 25.

In another method, as shown in FIGS. 19 and 20, a cap material board including a plurality of integral cap regions 15 aligned vertically or horizontally or arranged in a matrix may be prepared by molding a synthetic resin and bonded to the material board A. Subsequently, cutting is performed along the vertical cutting lines B1 and the horizontal cutting lines B2 by dicing, whereby a plurality of surface mount type photo interrupters 11 each including a cap 15 are obtained.

With this method, molding of a synthetic resin and bonding to the material board A for forming a cap can be performed simultaneously with respect to a plurality of caps 15, so that the trouble of such process steps can be advantageously reduced.

2. Second Embodiment

FIGS. 21-24 show a surface mount type photo interrupter 111 according to a second embodiment of the present invention.

The surface mount type photo interrupter 111 comprises an insulating substrate 112 made of a heat-resistant insulating material such as glass epoxy, a light emitting element 113 and a light receiving element 114 which are mounted on the upper surface of the insulating substrate 112 to be laterally spaced from each other, and a cap 115 made of opaque synthetic resin and bonded to the upper surface of the insulating substrate 112.

The light emitting element 113 on the upper surface of the insulating substrate 112 comprises a pair of conductor patterns 113a and 113b, a light emitting diode chip 113c die-bonded to the conductor pattern 113a, and a metal wire 113d connecting the light emitting diode chip 113c and the conductor pattern 113b by wire bonding.

The light receiving element 114 on the upper surface of the insulating substrate 112 comprises a pair of conductor patterns 114a and 114b, a light receiving chip 114c such as a phototransistor die-bonded to the conductor pattern 114a, and a metal wire 4d connecting the light receiving chip 114c and the conductor pattern 114b by wire bonding.

The lower surface of the insulating substrate 112 is formed, on the light emitting element 113 side, with a terminal electrode 118 electrically connected to the conductor pattern 113a of the light emitting element 113 via a conductor 117 provided in a through-hole 16, and a terminal electrode 121 electrically connected to the conductor pattern 113b of the light emitting element 113 via a conductor 120 provided in a through-hole 119.

The lower surface of the insulating substrate 112 is further formed, on the light receiving element 114 side, with a terminal electrode 124 electrically connected to the conductor pattern 141a of the light receiving element 114 via a conductor 123 provided in a through-hole 122, and a terminal electrode 127 electrically connected to the conductor pattern 114b of the light receiving element 114 via a conductor 126 provided in a through-hole 125.

The cap 115 includes a first hollow part 115a accommodating the light emitting element 113, a second hollow part 115b accommodating the light receiving element 114 and a connecting portion 115c integrally connecting the two hollow parts 115a and 115b to each other. On the connecting portion 115c, a groove 115d having an inner width W and a depth S is formed, in which an object 128 to be detected is to be placed.

In this embodiment, the cap 115 is prepared firstly in a state without the groove 115d at the connecting portion 115c, and then part of the connecting portion 115c is removed by machining such as dicing to provide the groove as will be described later.

Respective inner side walls of the two hollow parts 115a and 115b, which face each other, are formed with slits 115a' and 115b' for passing light. The first hollow part 115a includes a reflection surface 115a" for reflecting the light emitted from the light emitting element 113 toward the slits 115a' and 115b'. The second hollow part 115b includes a reflection surface 115b" for reflecting the light traveling through the slits 115a' and 115b' toward the light receiving element 114.

In the first hollow part 115a of the cap 115, a transparent sealing member 129 for the light emitting element 3 is provided. In the second hollow part 115b of the cap 115, a transparent sealing member 130 for the light receiving element 114 is provided. The sealing members are formed by injecting transparent liquid resin through the slits 115a' and 115b' and then hardening the resin by e.g. drying as will be described later in detail.

The photo interrupter 111 having the above-described structure can be mounted on e.g. a printed circuit board in various kinds of electrical apparatus by soldering the terminal electrodes 118, 121, 124 and 127 provided on the lower surface of the insulting substrate 2.

In the mounted state, when an object 128 does not exist in the groove 115d, the light emitted from the light emitting element 113 travels across the groove 115d to reach the light receiving element 114. However, when the object 128 exists in the groove 115d, the light traveling toward the light receiving element 114 is blocked by the object 128. In this way, the presence or absence of the object 128 in the groove 115d is detected.

As noted above, the transparent sealing members 129 and 130 in the cap 115 for sealing the light emitting element 113 in the first hollow part 115a and the light receiving element 114 in the second hollow part 115b, respectively, are formed by injecting transparent liquid resin from the connecting portion 115c into the hollow parts 115a and 115b through the slits 115a' and 115b'. With this method, the light emitting element 113 and the light receiving element 114 can be easily sealed individually by respective sealing members 129 and 130 without performing dicing which is necessary for the prior art structure.

A method for manufacturing the surface mount type photo interrupter 111 of the second embodiment having the above-described structure will be described below.

First, as shown in FIGS. 25-28, a material board A' including a plurality of regions which are later to become insulating substrates 112 and which are integrally arranged in a matrix is prepared using a heat-resistant insulating material such as glass epoxy.

The material board A' is later to be cut into individual insulating substrates 112 by dicing along the vertical cutting lines B1' and the horizontal cutting lines B2' as will be described later in detail.

Figure 29:
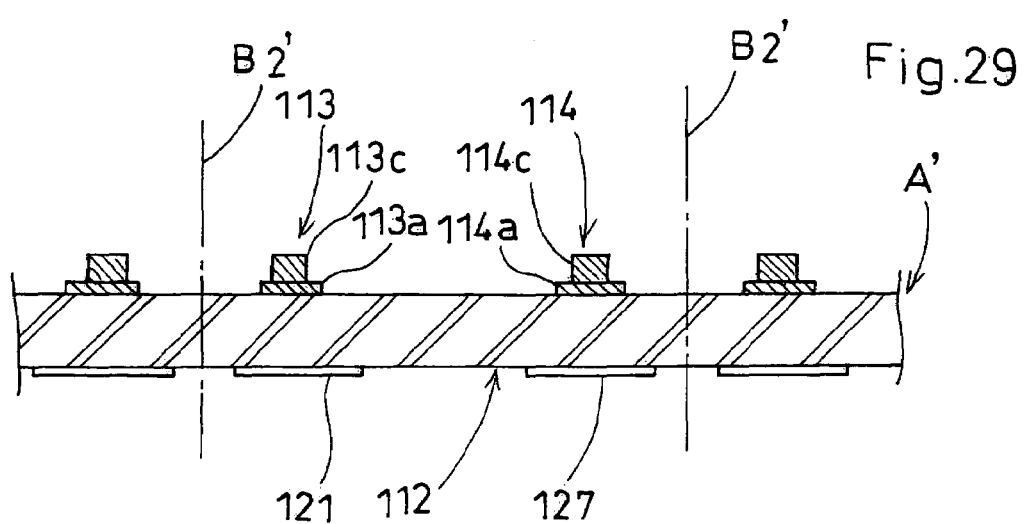
FIG. 29 is a sectional view showing the state in which a light emitting element and a light receiving element are mounted.

With respect to each of the regions of the material board A1 which are to become insulating substrates 112, conductor patterns 113a, 113b, 114a and 114b are formed on the upper surface, terminal electrodes 118, 121, 124 and 127 are formed on the lower surface, through-holes 116, 119, 122 and 125 are formed to penetrate therethrough, and conductors 117, 120, 123 and 126 are formed in the through-holes. Subsequently, as shown in FIG. 29, a light emitting element 113 and a light receiving element 114 are mounted on each of the regions of the material board A' which are to become insulating substrates 112. Specifically, die bonding of chips 113c and 114c and wire bonding using metal wires 113d and 114d are performed.

Figure 30:
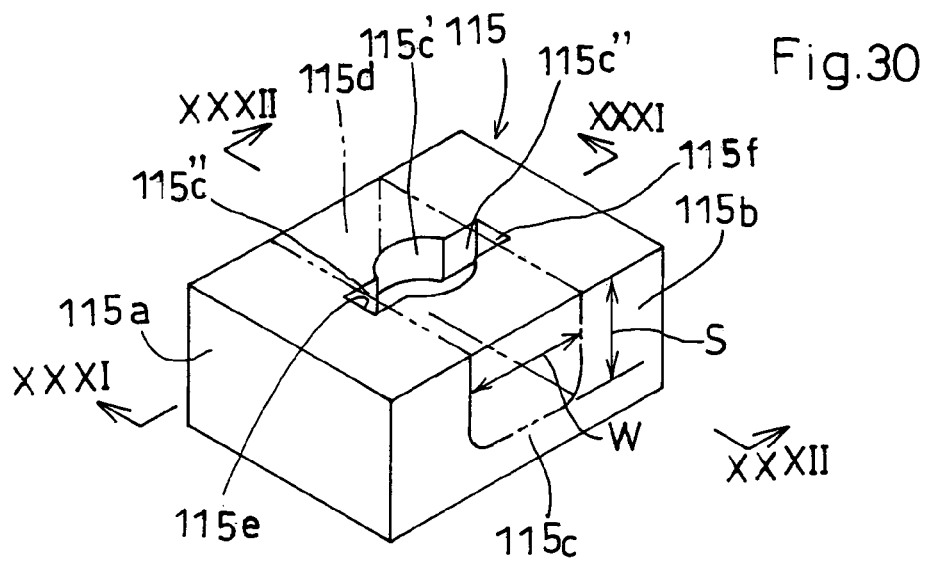
FIG. 30 is a perspective view showing a cap.
Figure 31:
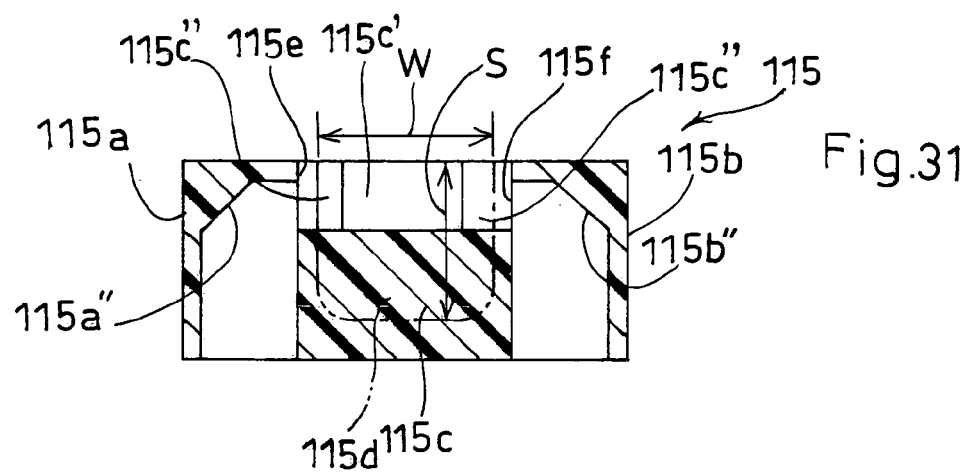
FIG. 31 is a sectional view taken along lines XXXI-XXXI in FIG. 30.
Figure 32:
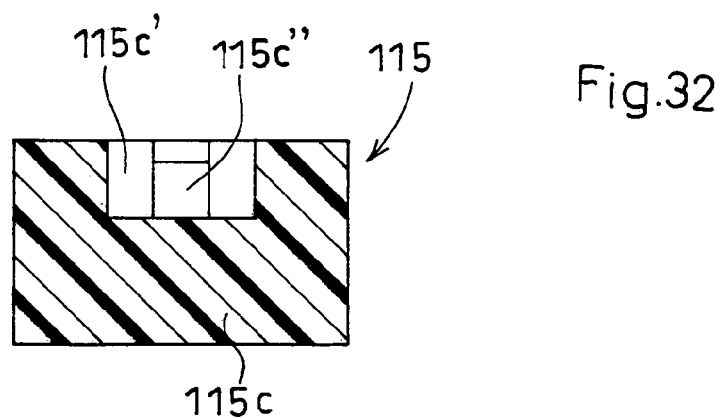
FIG. 32 is a sectional view taken along lines XXXII-XXXII in FIG. 30.

Meanwhile, a cap 115 is prepared to have such a structure as shown in FIGS. 30-32 by using opaque synthetic resin.

Specifically, the cap 115 prepared includes a first hollow part 115a for accommodating the light emitting element 113, a second hollow part 115b for accommodating the light receiving element 114, a connecting portion 115c integrally connecting the two hollow parts 115a and 115b to each other.

Respective inner side walls of the two hollow parts 115a and 115b which face each other are formed with slits 115e and 115f for passing light. The upper surface of the connecting portion 115c is formed with an injection recess 115c', and injection grooves 115c" extend from the injection recess 115c' toward the slits 115e and 115f.

Figure 33:
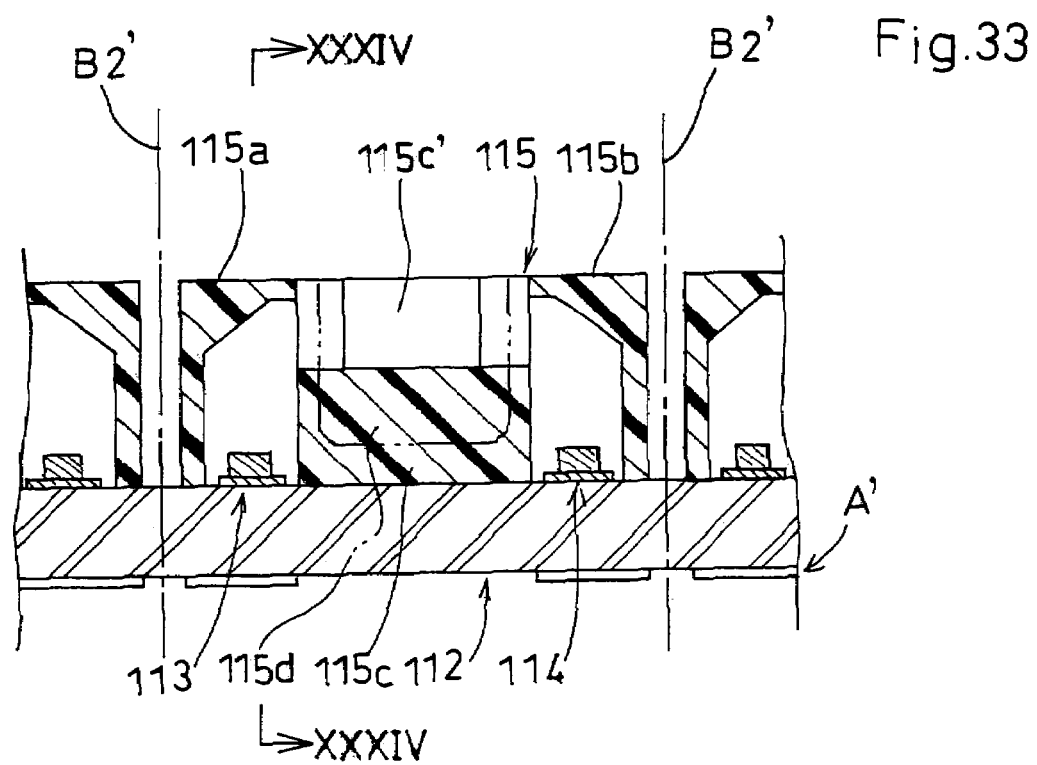
FIG. 33 is a sectional view showing the state in which a cap is bonded.
Figure 34:
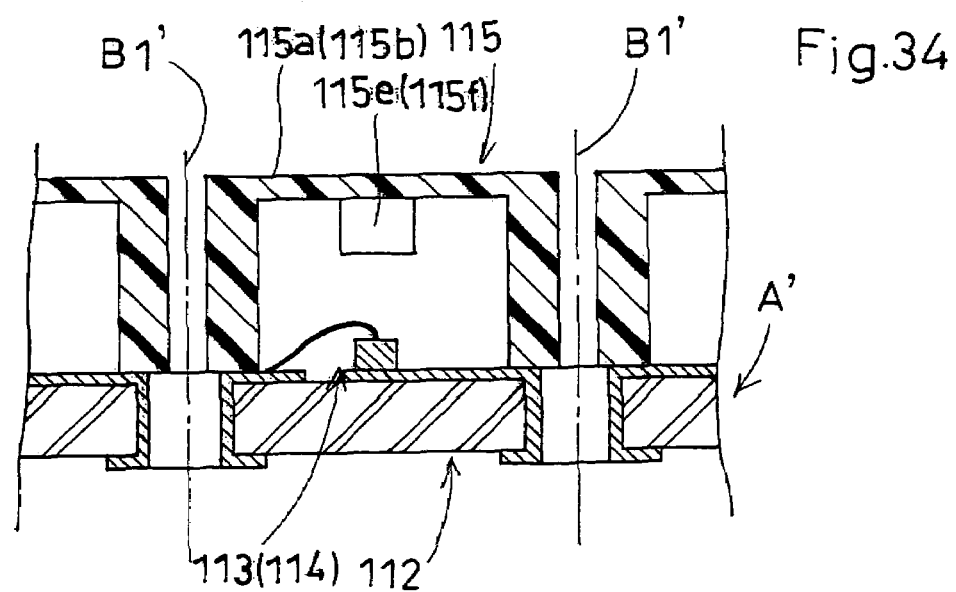
FIG. 34 is a sectional view taken along lines XXXIV-XXXIV in FIG. 33.

Subsequently, as shown in FIGS. 33 and 34, the cap 115 is supplied onto each of the regions of the material board A' which are to become insulating substrates 112 and bonded thereto by using e.g. a non-illustrated adhesive so that the first hollow part 115a and the second hollow part 115b accommodate the light emitting element 113 and the light receiving element 114, respectively.

Figure 35:
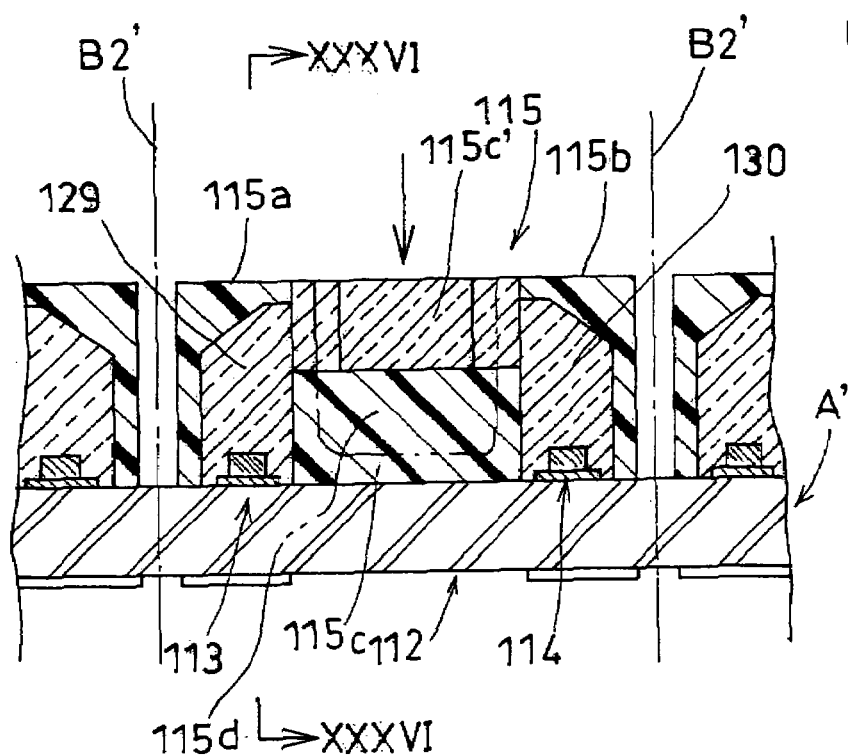
FIG. 35 is a sectional view showing the state in which a transparent sealing member is provided.
Figure 36:
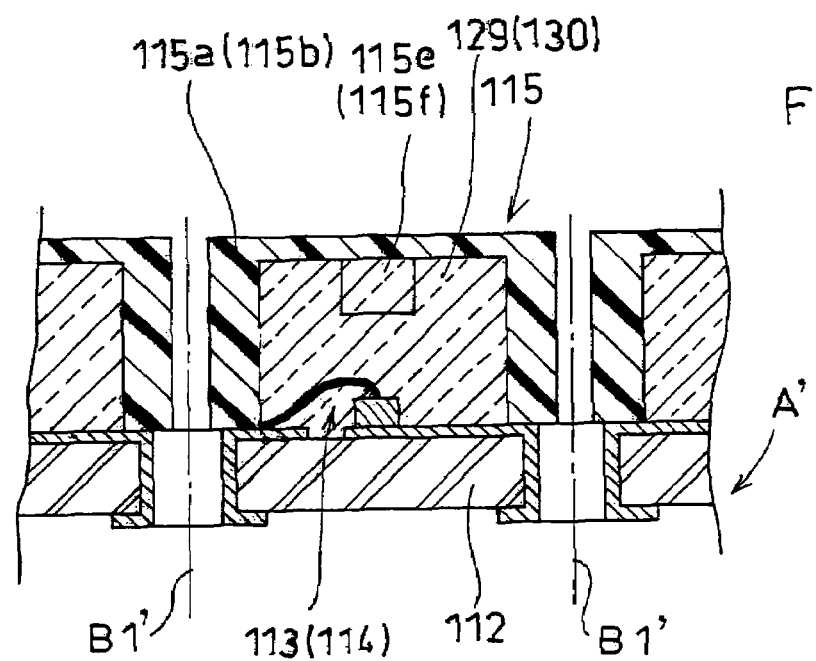
FIG. 36 is a sectional view taken along lines XXXVI-XXXVI in FIG. 35.

Then, transparent resin in the liquid state is supplied using a non-illustrated nozzle into the injection recess 115c' provided on the connecting portion 115c so that the transparent liquid resin flows into the hollow parts 115a and 115b of the cap 115 through the slits 115e and 115f. In this way, the injection of resin can be performed simultaneously with respect to the two hollow parts until the hollow parts are filled or half filled, for example. Thereafter, the transparent liquid resin is hardened by drying, for example. Thus, as shown in FIGS. 35 and 36, transparent sealing members 129 and 130 sealing the light emitting element 113 and the light receiving element 114 are simultaneously formed in the first hollow part 115a and the second hollow part 115b, respectively.

Figure 37:
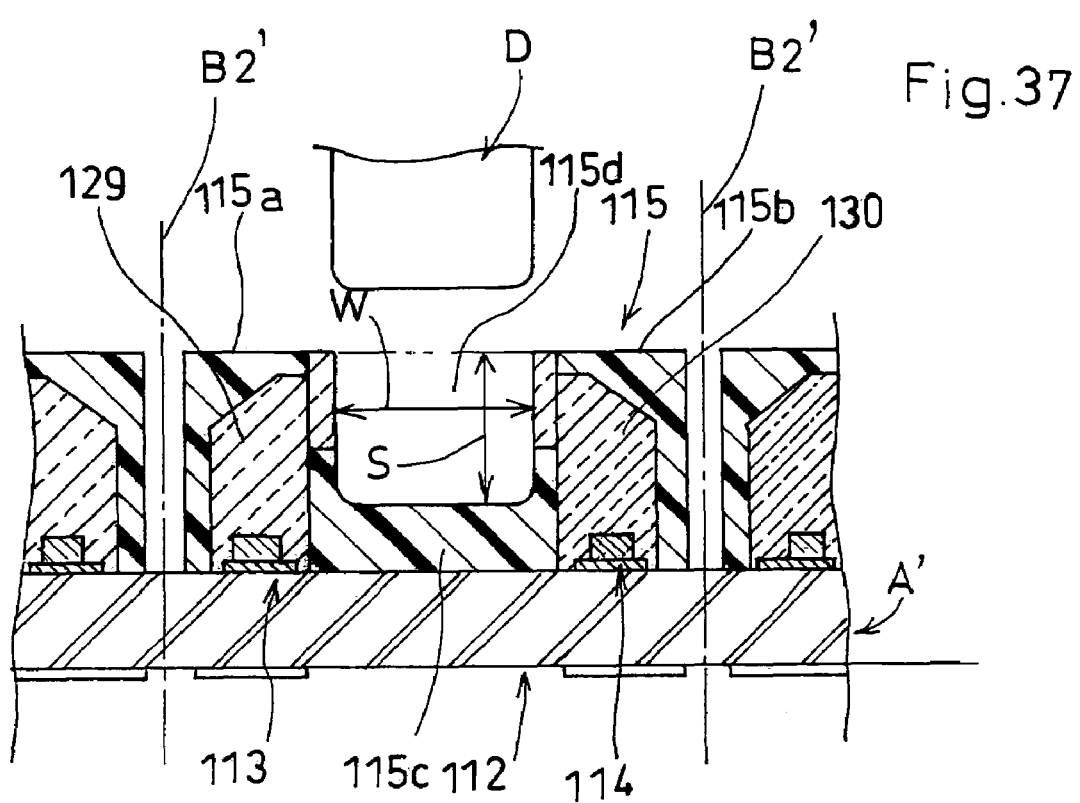
FIG. 37 is a sectional view showing the state in which a groove is formed.

Subsequently, as shown in FIG. 37, the connecting portion 115c of the cap 115 is subjected to machining using a machining tool such as a dicing tool D. By this machining, the part including the injection recess 115c' and the injection grooves 115c" is removed, and a groove 115d having an inner width W and a depth S is formed on the connecting portion 115c, in which the object 128 is to be placed.

Figure 38:
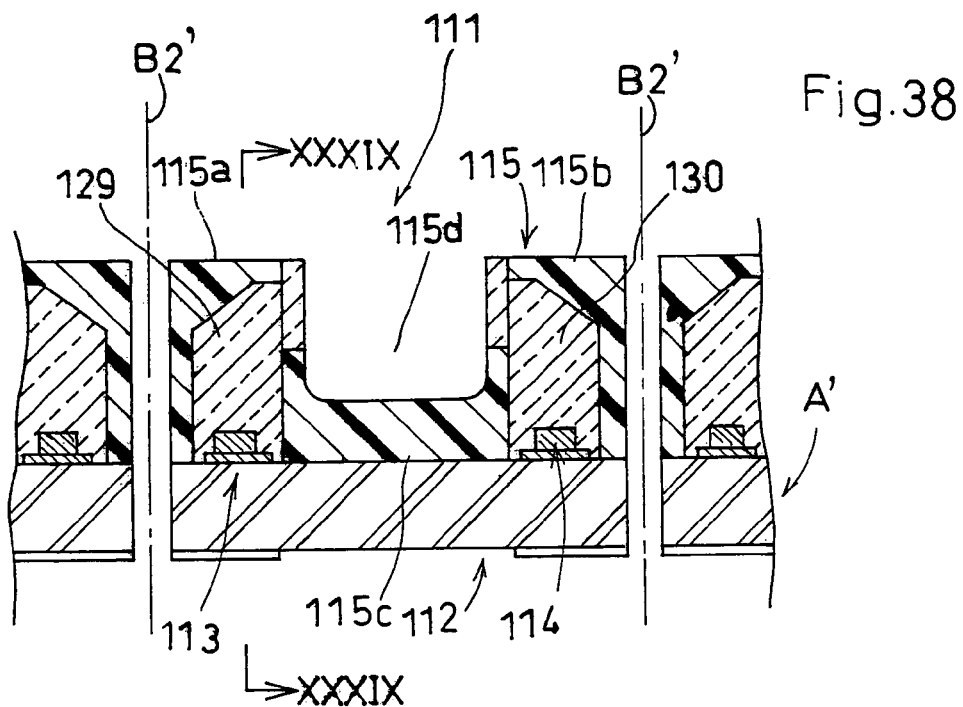
FIG. 38 is a sectional view showing the state in which a plurality of photo interrupters are obtained by division.
Figure 39:
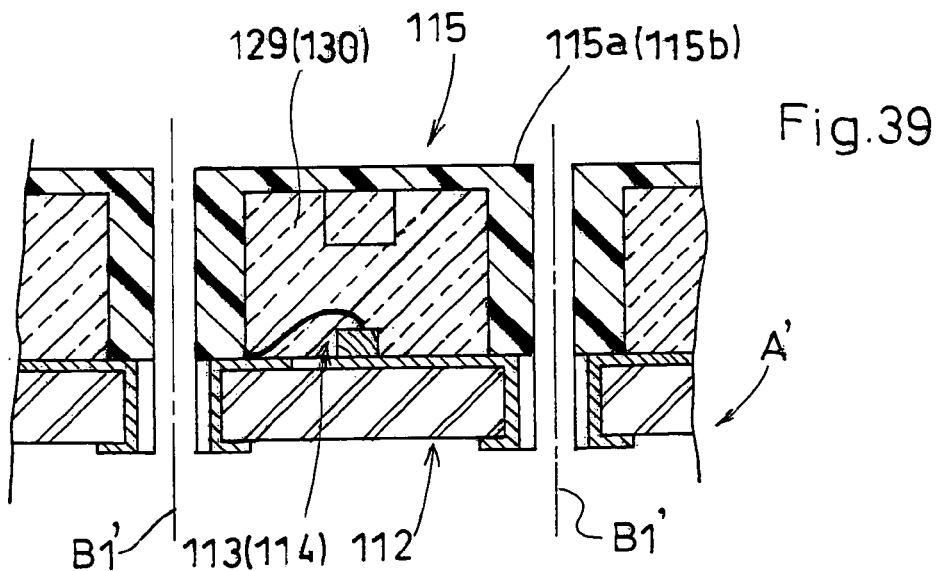
FIG. 39 is a sectional view taken along lines XXXIX-XXXIX in FIG. 38.

Subsequently, as shown in FIGS. 38 and 39, the material board A' is cut along the vertical cutting lines B1' and the horizontal cutting lines B2' by dicing. In this way, a plurality of surface mount type photo interrupters 111 each having the structure as shown in FIGS. 21-24 are obtained simultaneously.

Figure 40:
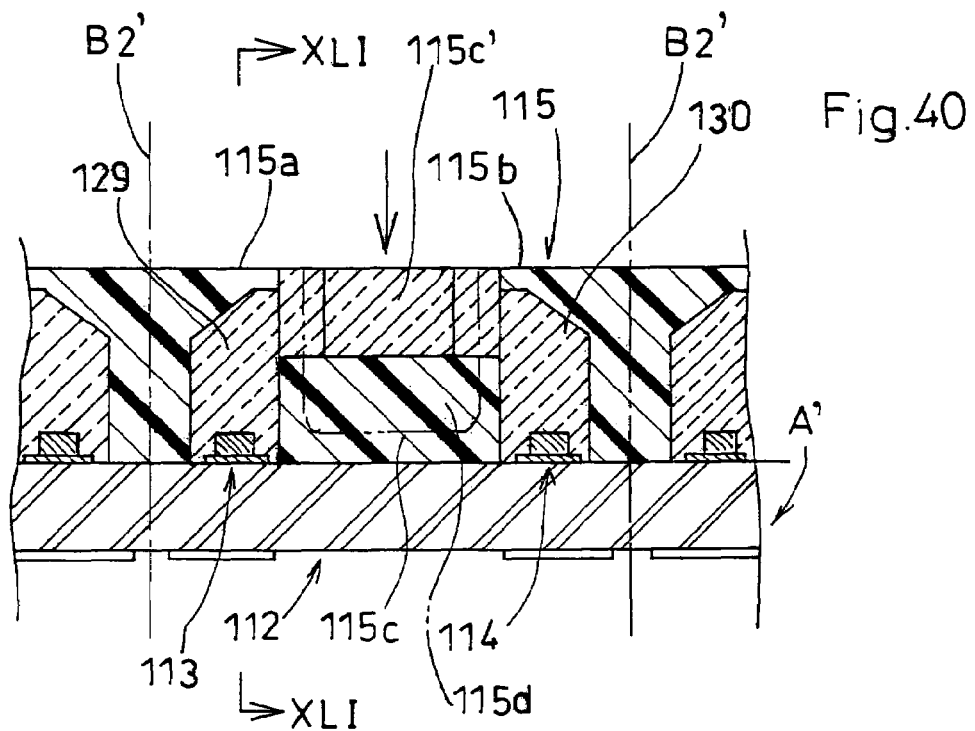
FIG. 40 is a sectional view showing another manufacturing method of the second embodiment.
Figure 41:
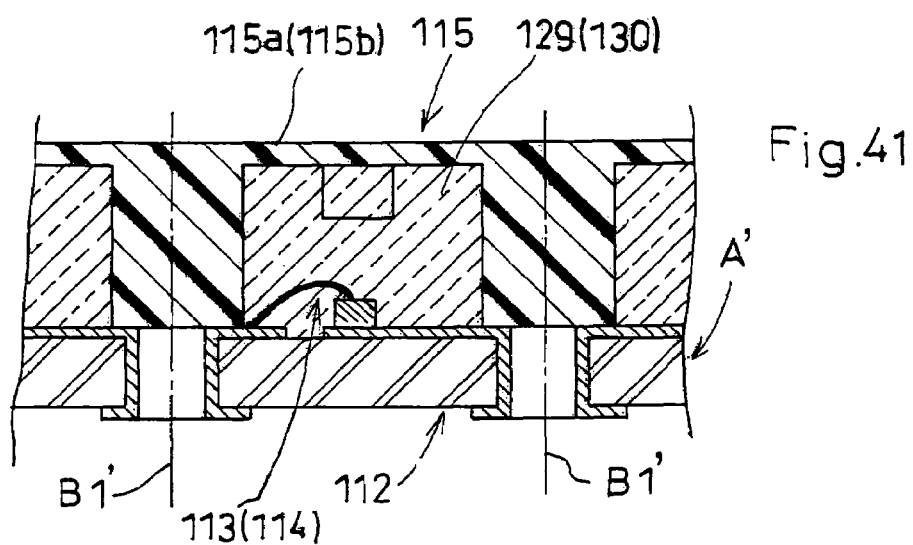
FIG. 41 is a sectional view taken along lines XLI-XLI in FIG. 40.
Figure 42:
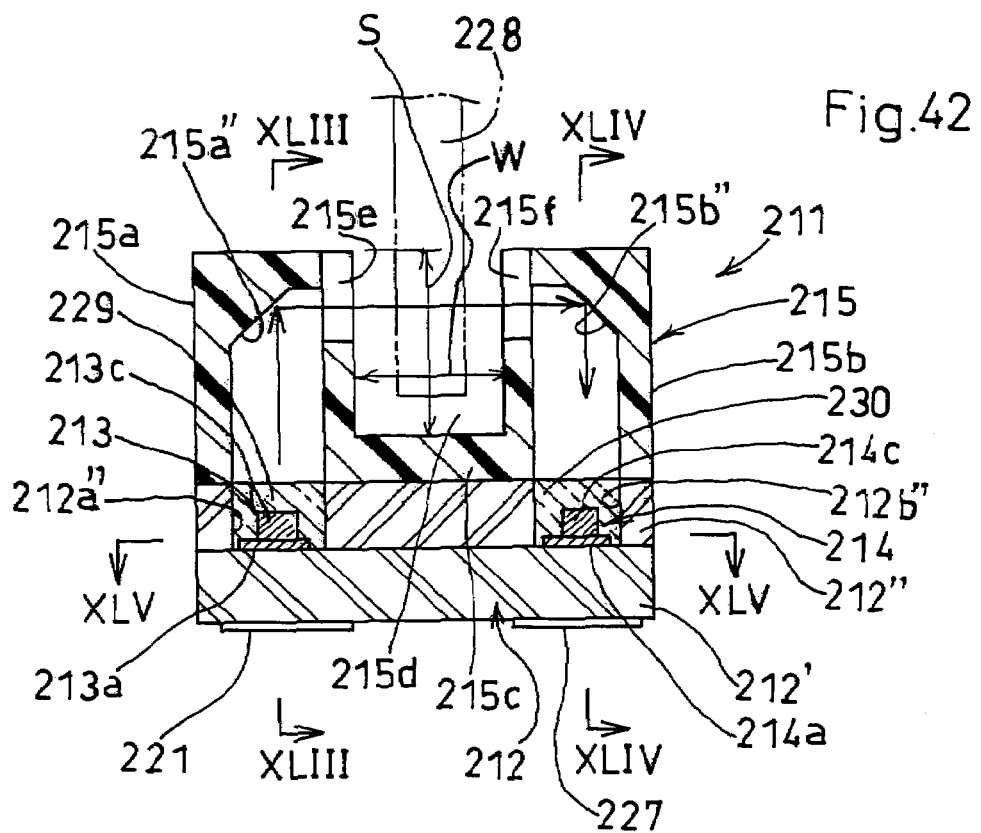
FIG. 42 is a sectional view showing a surface mount type photo interrupter of a third embodiment.
Figure 43:
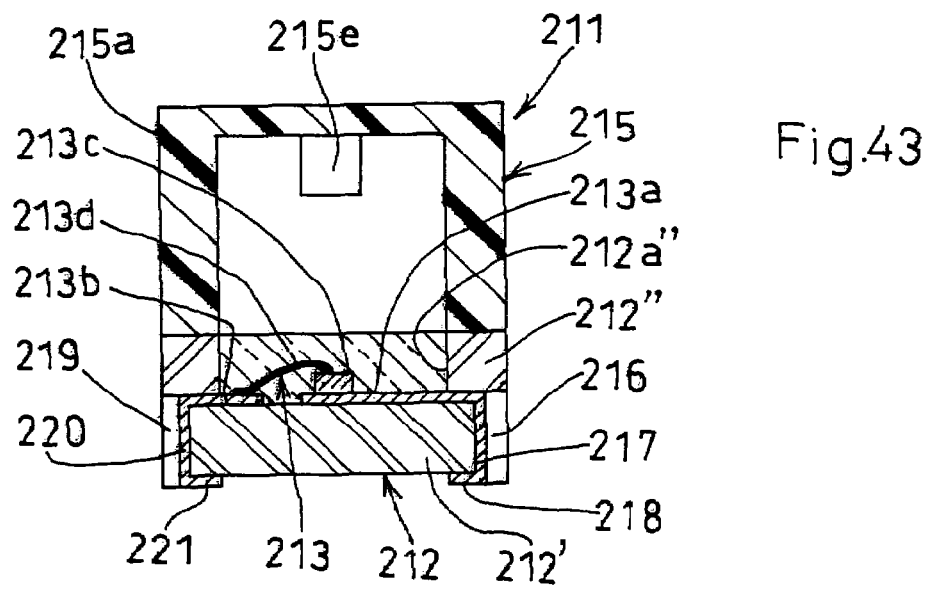
FIG. 43 is a sectional view taken along lines XLIII-XLIII in FIG. 42.
Figure 44:
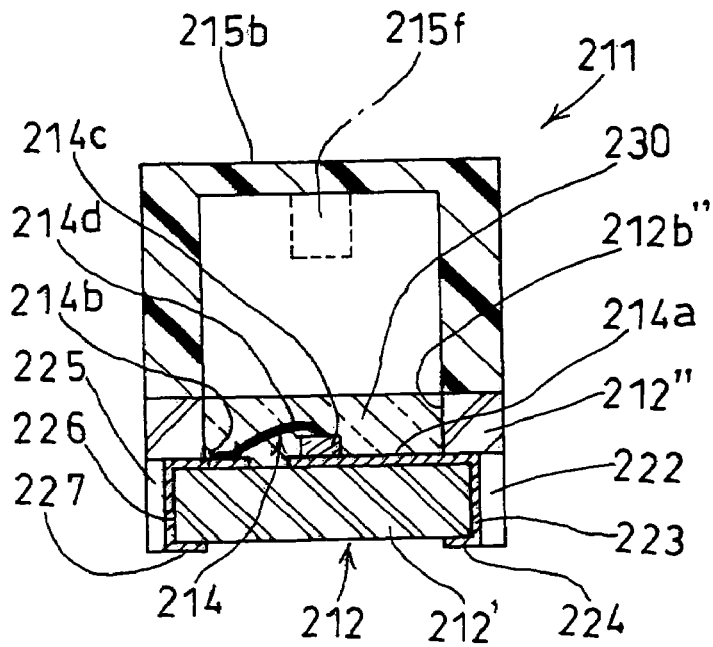
FIG. 44 is a sectional view taken along lines XLIV-XLIV in FIG. 42.
Figure 45:
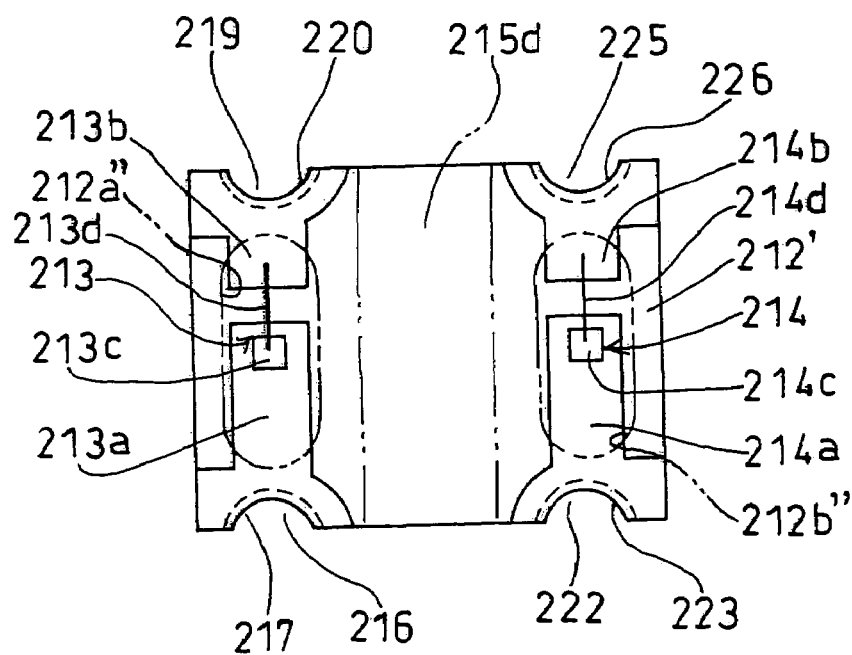
FIG. 45 is a sectional view taken along lines XLV-XLV in FIG. 42.

In another method, as shown in FIGS. 40 and 41, a cap material board including a plurality of integral cap regions 115 aligned vertically or horizontally or arranged in a matrix may be prepared by molding a synthetic resin and bonded to the material board A'. Subsequently, the cap material board is cut along the vertical cutting lines B1' and the horizontal cutting lines B2' by dicing, whereby a plurality of surface mount type photo interrupters 111 each including a cap 115 are obtained.

With this method, molding of a synthetic resin and bonding to the material board A' for forming a cap can be performed simultaneously with respect to a plurality of caps, so that the trouble of such process steps can be advantageously reduced.

3. Third Embodiment

FIGS. 42-45 show a surface mount type photo interrupter 211 according to a third embodiment of the present invention.

The photo interrupter 211 includes an insulating substrate 212 which comprises a main insulating substrate 212' made of an insulating material such as glass epoxy and an auxiliary insulating substrate 212" made of the same insulating material as that of the main insulating substrate 212' and laminated and bonded on the main insulating substrate.

The auxiliary insulating substrate 212", which is on the upper side, is formed with a pair through-holes 212a" and 212b" which are elongated in plan view and laterally spaced from each other.

The main insulating substrate 212', which is on the lower side, has an upper surface on which a light emitting element 213 is provided at a position within the through-hole 212a". The light emitting element comprises a pair of conductor patterns 213a and 213b, a light emitting diode chip 213c die-bonded to the conductor pattern 213a, and a metal wire 213d connecting the light emitting diode chip 213c and the conductor pattern 213b by wire bonding.

A light receiving element 214 is also provided on the upper surface of the main insulating substrate 212' at a position within the other through-hole 212b". The light receiving element comprises a pair of conductor patterns 214a and 214b, a light receiving chip 214c such as a phototransistor die-bonded to the conductor pattern 214a, and a metal wire 214d connecting the light receiving chip 214c and the conductor pattern 214b by wire bonding.

In the through-hole 212a" of the auxiliary insulating substrate 212", a transparent sealing member 229 is provided to hermetically seal the light emitting element 213. This sealing member is formed by injecting transparent liquid resin into the through-hole and then hardening the resin. In the through-hole 212b" of the auxiliary insulating substrate 212", a transparent sealing member 230 is provided to hermetically seal the light receiving element 214. This sealing member is formed by injecting transparent liquid resin into the through-hole and then hardening the resin by drying, for example.

The main insulating substrate 212' of the insulating substrate 212 has a lower surface which is formed, on the light emitting element 213 side, with a terminal electrode 218 electrically connected to the conductor pattern 213a of the light emitting element 213 via a conductor 217 provided in a through-hole 216, and a terminal electrode 221 connected to the conductor pattern 213b of the light emitting element 213 via a conductor 220 provided in a through-hole 219.

The lower surface of the main insulating substrate 212' is further formed, on the light receiving element 214 side, with a terminal electrode 224 electrically connected to the conductor pattern 214a of the light receiving element 214 via a conductor 224 provided in a through-hole 222, and a terminal electrode 227 connected to the conductor pattern 214b of the light receiving element 214 via a conductor 226 provided in a through-hole 225.

A cap 215 made of an opaque material is bonded to the upper surface of the auxiliary insulating substrate 212" of the insulating substrate 212. The cap is formed with a groove 215d at a position between the light emitting element 213 and the light receiving element 214 so that an object 228 to be detected is placed in the groove.

The cap 215 includes a first hollow portion 215a provided on the light emitting element 213 side, a second hollow portion 215b provided on the light receiving element 214 side, and a connecting portion 215c integrally connecting the two hollow portions 215a and 215b to each other. The groove 215d is provided on the connecting portion 215c to have an inner width W and a depth S.

The cap 215 is so structured that the light emitted from the light emitting element 213 in the first follow portion 215a is reflected at a reflection surface 215a" in the first hollow portion 215a to travel horizontally through a slit 215e and across the groove 215d. The light then enters the second hollow portion 215b through another slit 215f and is reflected at a reflection surface 215b" in the second hollow portion 215b to travel downward to reach the light receiving element 214.

The photo interrupter 211 having the above-described structure can be mounted on e.g. a printed circuit board in various kinds of electrical apparatus by soldering the terminal electrodes 218, 221, 224 and 227 provided on the lower surface of the main insulting substrate 212'.

When an object 228 does not exist in the groove 215*d*, the light emitted from the light emitting element 213 travels across the groove 215*d* to reach the light receiving element 214. However, when the object 228 exists in the groove 215*d*, the light traveling toward the light receiving element 214 is blocked by the object 228. In this way, the presence or absence of the object 228 in the groove 215*d* is detected. As noted above, the insulating substrate 212 has a laminated structure made up of the main insulating substrate 212' and the auxiliary insulating substrate 212" which are laminated and bonded together. Therefore, the warping or deformation of the laminated substrate structure due to an external force is less likely to occur as compared with the prior art structure in which only a single insulating substrate is used.

Since the main insulating substrate 212' and the auxiliary insulating substrate 212" are made of the same material, the warping or deformation due to the difference in thermal expansion between the two substrates is also prevented.

Further, since the light emitting element 213 and the light receiving element 214 are respectively arranged in the through-hole 212*a*" and 212*b*" formed in the auxiliary insulating substrate 212" and sealed by the transparent sealing members 229 and 230 within the through-holes 212*a*" and 212*b*", the auxiliary insulating substrate 212" reliably prevents the light emitted from the light emitting element 213 from directly reaching the light receiving element 214 without passing across the groove 215*d* of the cap 215.

Similarly to the first and the second embodiments, in the surface mount type photo interrupter 211 of the third embodiment again, the transparent sealing members 229 and 230 for the light emitting element 213 and the light receiving element 214 can be provided by injecting transparent liquid resin into the hollow portions 215*a* and 215*b* until the hollow portions are filled or half filled, for example, and then hardening the resin by drying, for example.

A method for manufacturing the surface mount type photo interrupter 211 of the third embodiment having the above-described structure will be described below.

Figure 48:
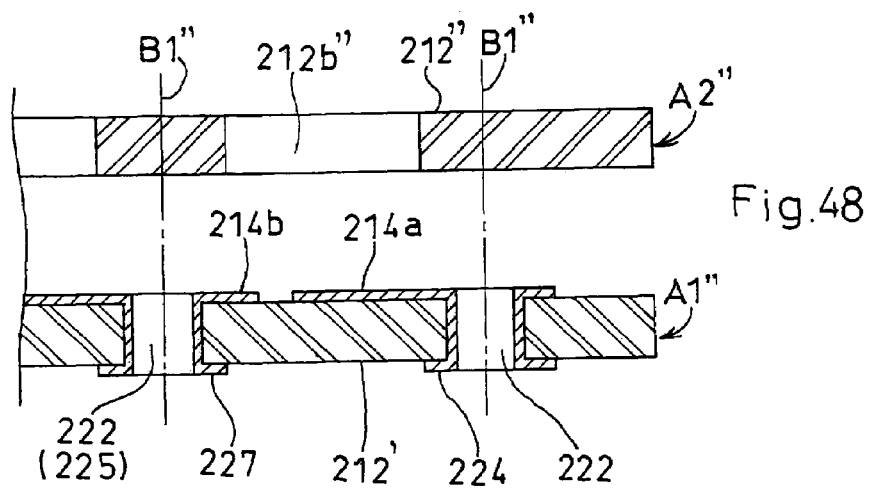
FIG. 48 is an enlarged sectional view taken along lines XLVIII-XLVIII in FIG. 46.

First, as shown in FIGS. 46, 47 and 48, a main material board A1" including a plurality of regions which are later to become main insulating substrates 212' and which are integrally arranged in a matrix is prepared using a glass epoxy plate. Similarly, a sub material board A2" including a plurality of regions which are later to become auxiliary insulating substrates 212" and which are integrally arranged in a matrix is prepared using a glass epoxy plate.

The main material board A1" and the sub material board A2" are later to be laminated together to become a material board A" and then cut into individual insulating substrates 212 by dicing along the vertical cutting lines B1" and the horizontal cutting lines B2' as will be described later in detail.

With respect to each of the regions of the main material board A1" which are to become main insulating substrates 212', conductor patterns 213*a*, 213*b*, 214*a* and 214*b* are formed on the upper surface, terminal electrodes 218, 221, 224 and 227 are formed on the lower surface, through-holes 216, 219, 222 and 225 are formed to penetrate therethrough, and conductors 217, 220, 223 and 226 are formed in the through-holes.

Further, through-holes 212*a*" and 212*b*" are formed with respect to each of the regions of the sub material board A2" which are to become auxiliary insulating substrates 212".

Figure 49:
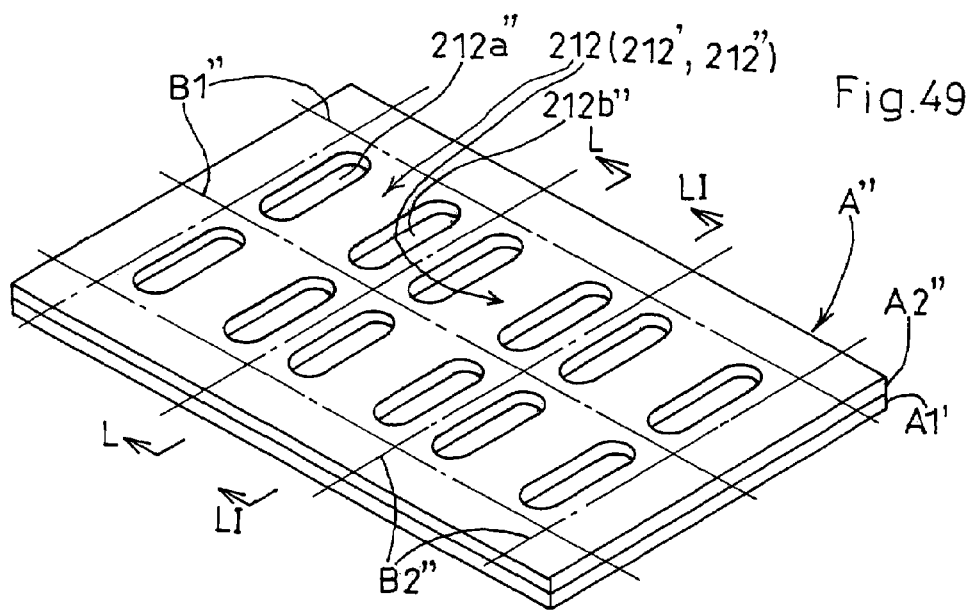
FIG. 49 is a perspective view showing a laminated material board.
Figure 50:
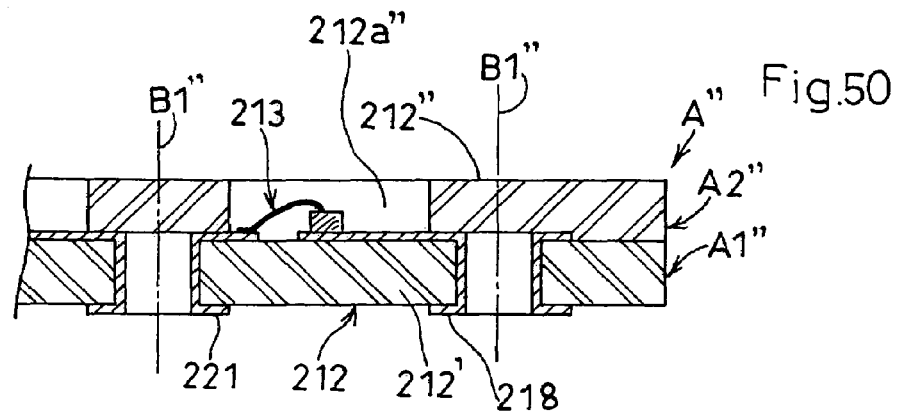
FIG. 50 is an enlarged sectional view taken along lines L-L in FIG. 49.
Figure 51:
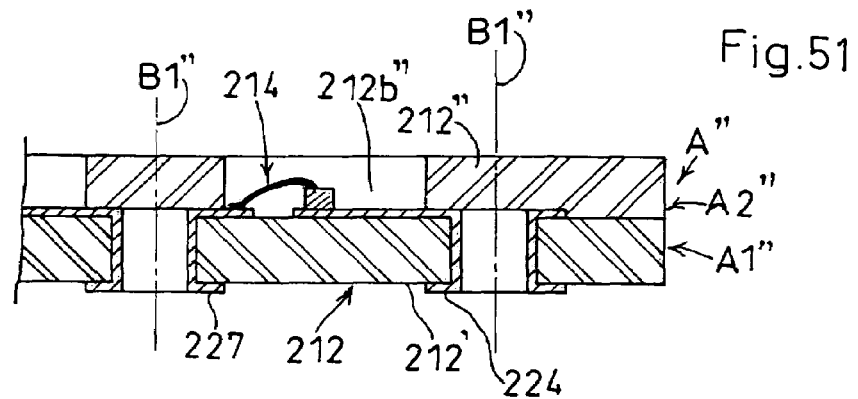
FIG. 51 is an enlarged sectional view taken along lines LI-LI in FIG. 49.
Figure 52:
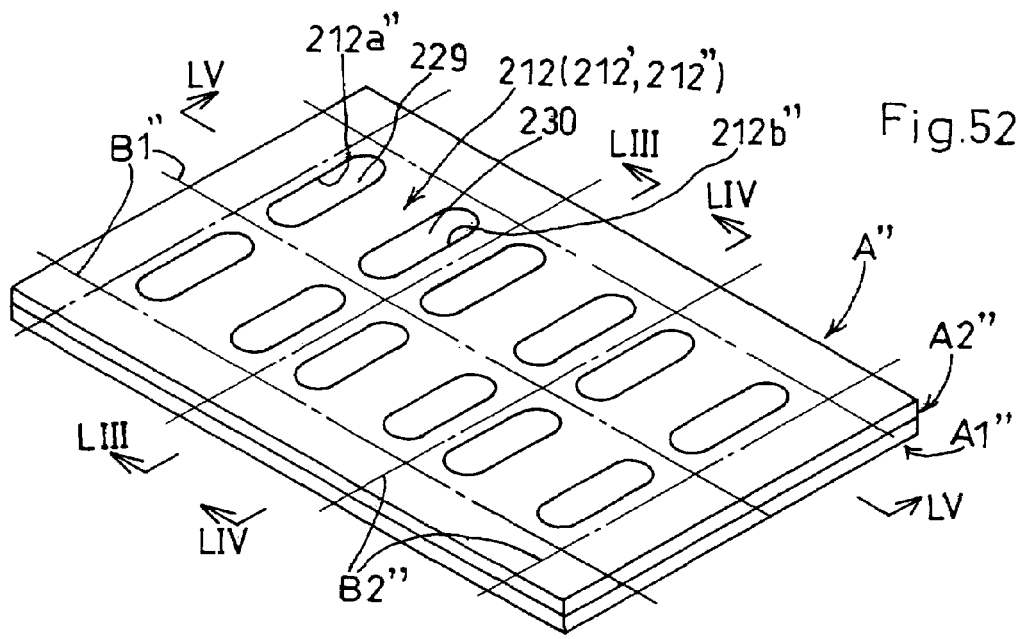
FIG. 52 is a perspective view showing the state in which transparent sealing members are provided.
Figure 53:
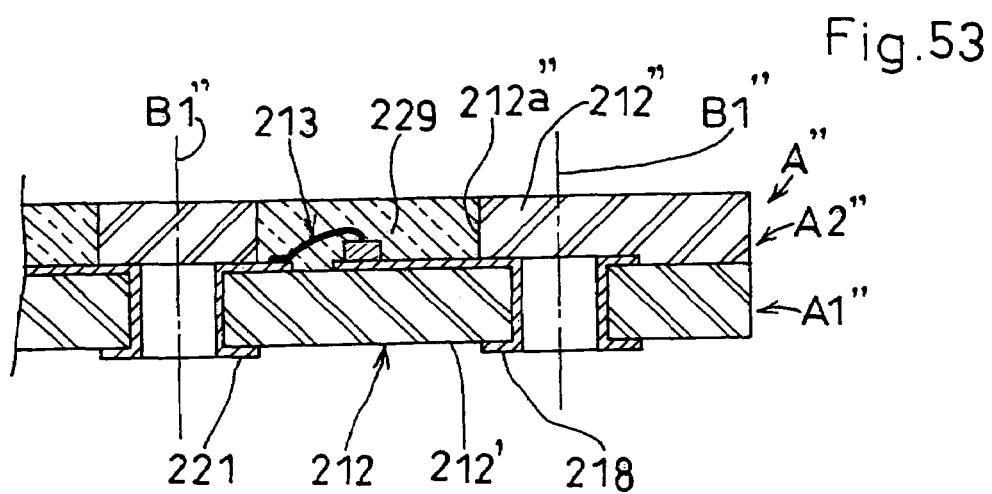
FIG. 53 is an enlarged sectional view taken along lines LIII-LIII in FIG. 52.
Figure 54:
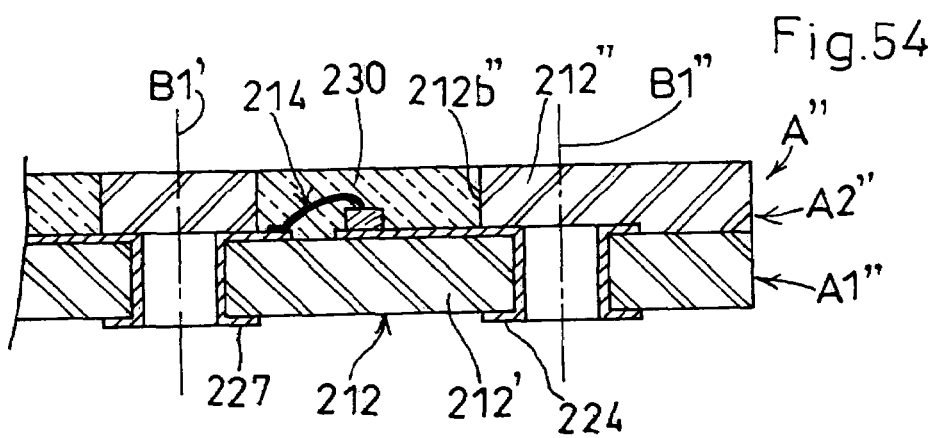
FIG. 54 is an enlarged sectional view taken along lines LIV-LIV in FIG. 52.
Figure 55:
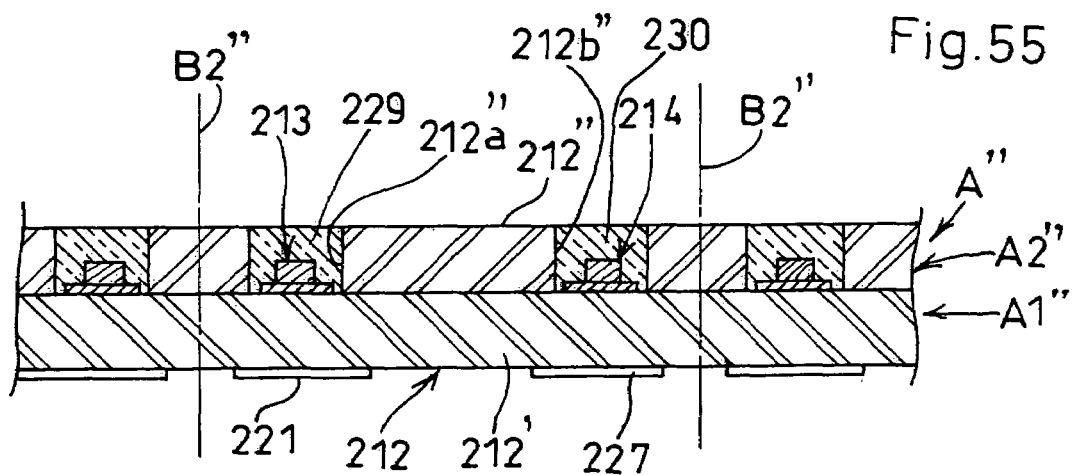
FIG. 55 is an enlarged sectional view taken along lines LV-LV in FIG. 52.
Figure 56:
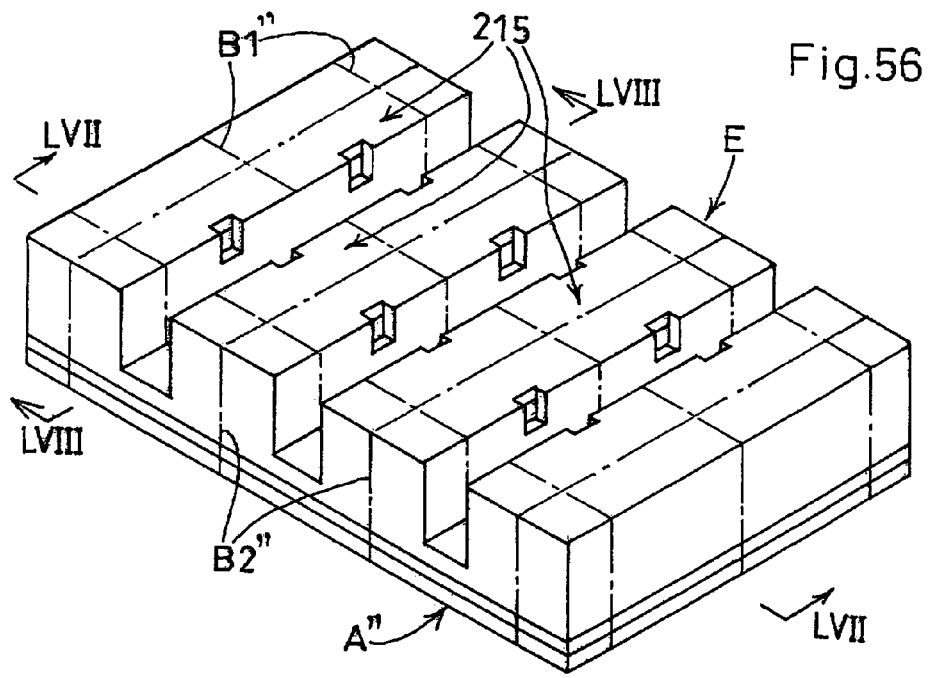
FIG. 56 is a perspective view showing the state in which a cap is bonded.
Figure 57:
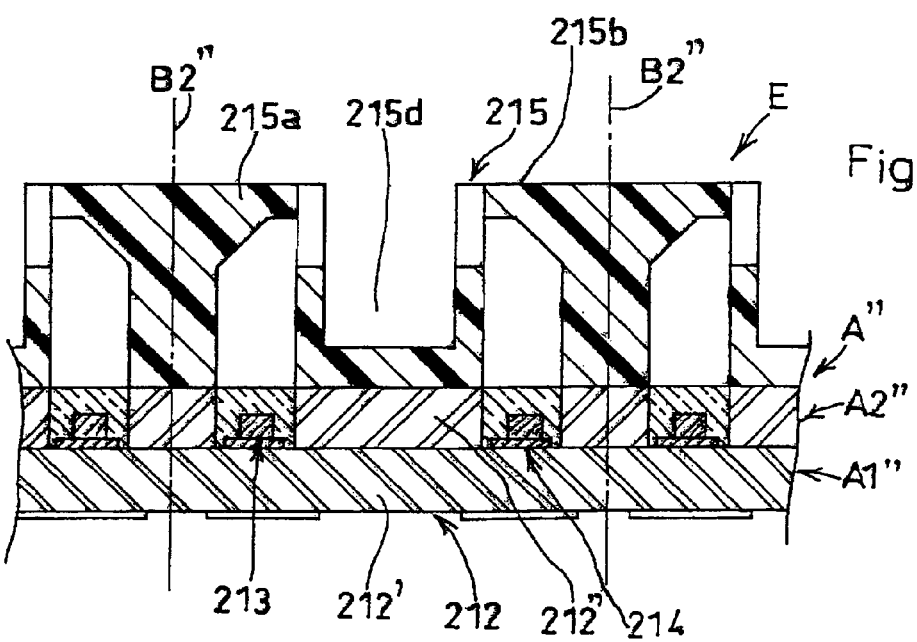
FIG. 57 is an enlarged sectional view taken along lines LVII-LVII in FIG. 56.
Figure 58:
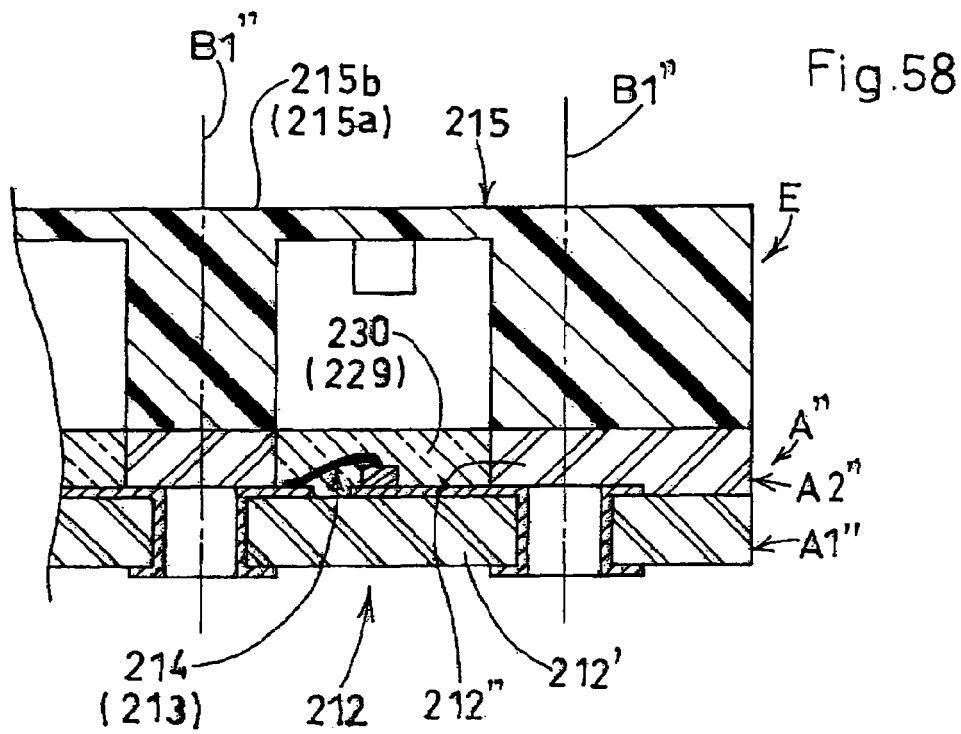
FIG. 58 is an enlarged sectional view taken along lines LVIII-LVIII in FIG. 56.

Subsequently, as shown in FIGS. 49, 50 and 51, the sub material board A2" is laminated on the main material board A1" and bonded thereto to provide a material board A".

Subsequently, light emitting diode chips 213*c* and light receiving chips 214*c* are die-bonded respectively in the through-holes 212*a*" and the through-holes 212*b*" in the sub material board A2" of the material board A"". Then wire bonding of the metal wires 213*d*, 214*d* is performed.

The die-bonding of the light emitting diode chips 213*c* and the light receiving chips 214*c* and the wire-bonding using the metal wires 213*d*, 214*d* may be performed before the sub material board A2" is laminated and bonded to the main material board. However, the die-bonding and the wire-bonding can be performed more properly after the sub material board A2" is laminated and bonded on the main material board, because the material board A" obtained by such stacking has a high rigidity and is unlikely to be warped or deformed.

Then, as shown in FIGS. 52-55, transparent resin in the liquid state is injected into each of the through-holes 212*a*" and 212*b*" of the sub material board A2" and then hardened by drying, for example, whereby transparent sealing members 229 and 230 are provided.

Subsequently, a cap material board E prepared in advance and including a plurality of integral cap regions 215 arranged in a matrix is laminated and bonded on the sub material board A2" of the material board A".

Figure 59:
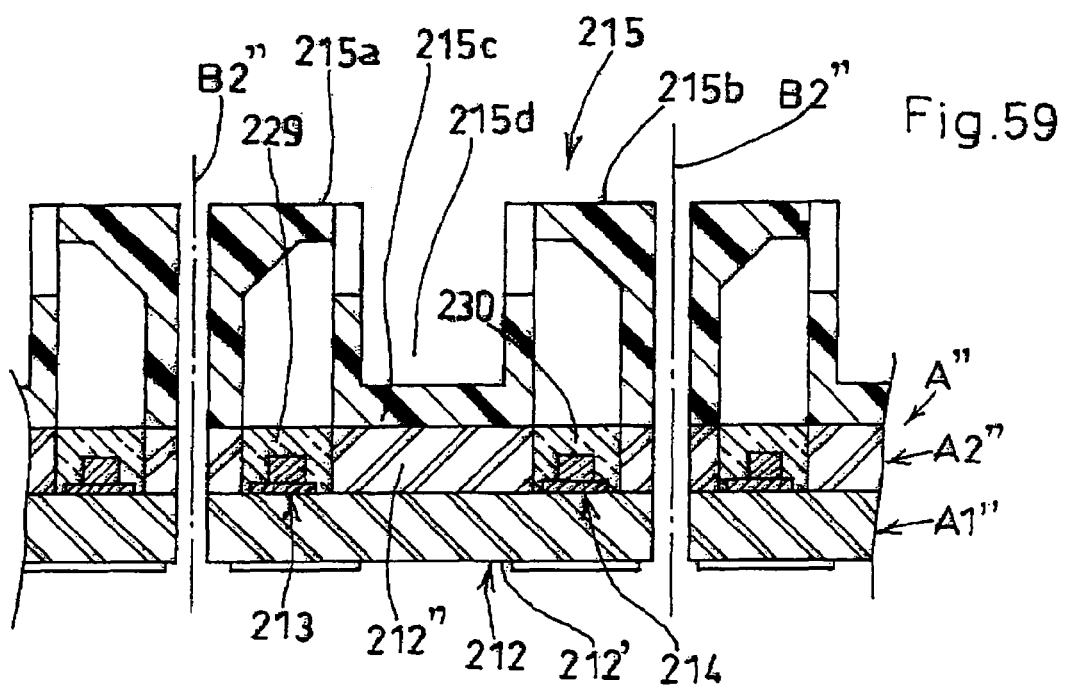
FIG. 59 is a sectional view showing the state in which a plurality of photo interrupters are obtained by division.
Figure 60:
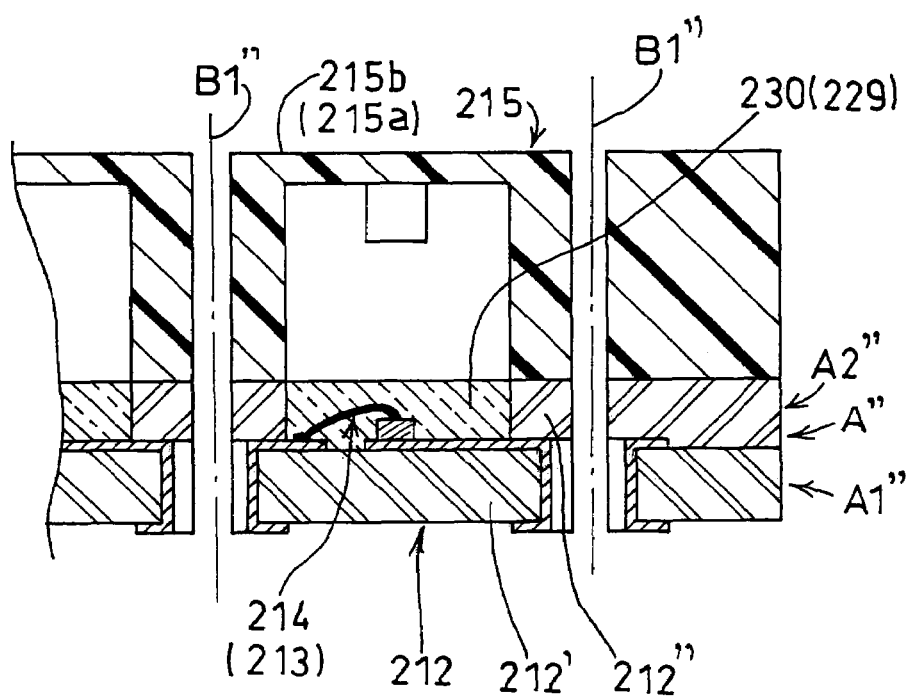
FIG. 60 is a sectional view showing the state in which a plurality of photo interrupters are obtained by division.

Then, as shown in FIGS. 59 and 60, the laminated structure made up of the material board A" and the cap material board E is cut along the vertical cutting lines B1" and the horizontal cutting lines B2" by dicing. In this way, surface mount type photo interrupters 211 each having the structure as shown in FIGS. 42-45 are obtained.

Figure 61:
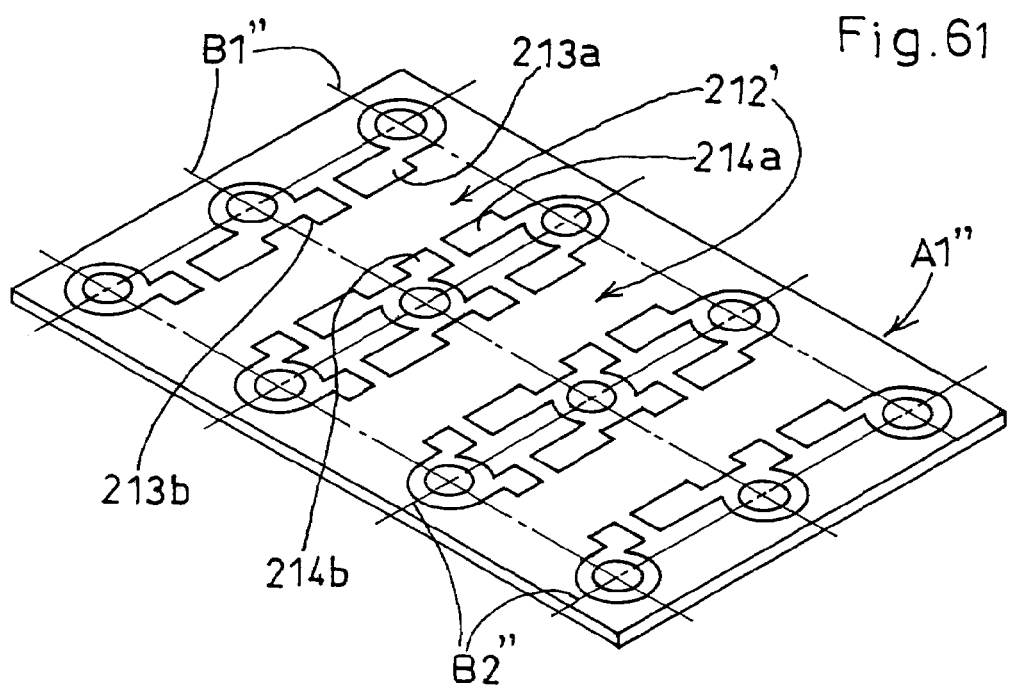
FIG. 61 is a perspective view showing another main material board of the third embodiment.

In another method, instead of forming the through-holes 216, 219, 222 and 225 of the main material board A1" along the vertical cutting lines B1", the through-holes may be formed at the intersection points of the vertical cutting lines B1" and the horizontal cutting lines B2", as shown in FIG. 61.

In such a case, the through-holes 216, 219, 222 and 225 are positioned at four corners of the insulating substrate 212 so that the number of through-holes which need be formed in the main material board A1" can be reduced as compared with the case where the through-holes are formed along the vertical cutting lines. Therefore, the manufacturing cost is reduced.

In the third embodiment, similarly to the first and the second embodiment, a plurality of caps 215 may be separately prepared and individually bonded to the material board A". Further, the injection of transparent liquid resin into the through-holes 212*a*" and 212*b*" in the auxiliary insulating substrate 212" of the insulating substrate 212 may be performed after the cap material board E or the caps 215 are bonded to the material board A" by injecting the resin into the two hollow portions 215*a* and 215*b* of each of the caps 215.

The invention claimed is:

1. A surface mount type photo interrupter comprising:
   an insulating substrate having an upper surface and a lower surface;
   a light emitting element and a light receiving element mounted on the upper surface of the insulating substrate in a laterally aligned manner;
   a pair of terminal electrodes formed on the lower surface of the insulating substrate for the light emitting element;
   another pair of terminal electrodes formed on the lower surface of the insulating substrate for the light receiving element; and
   a cap prepared separately from the insulating substrate, made of an opaque material and bonded to the upper surface of the insulating substrate, the cap including a first hollow portion accommodating the light emitting element, a second hollow portion accommodating the light receiving element, and a connecting portion connecting the first hollow portion and the second hollow portion to each other, the connecting portion being formed with a groove for receiving an object to be detected, the cap being so designed that light emitted from the light emitting element passes across the groove to reach the light receiving element;

wherein the light emitting element is arranged to emit light in a normal direction relative to the upper surface of the insulating substrate, the light receiving element being arranged to receive light traveling in a direction parallel to the normal direction, and wherein the photo interrupter further includes a pair of transparent sealing members which are made of transparent resin and provided respectively in the first hollow portion and the second hollow portion of the cap to seal the light emitting element and the light receiving element, the transparent sealing members being formed by injecting transparent liquid resin and then hardening the resin in a state in which the cap is bonded to the insulating substrate.

2. The surface mount type photo interrupter according to claim 1, wherein the cap is prepared firstly in a state where the groove at the connecting portion is unformed, and the groove is later formed by removing part of the connecting portion by machining, the part including an injection portion utilized for injecting the transparent liquid resin into the two hollow portions.

* * * * *